(12) United States Patent
Ahn et al.

(10) Patent No.: US 7,558,100 B2
(45) Date of Patent: Jul. 7, 2009

(54) PHASE CHANGE MEMORY DEVICES INCLUDING MEMORY CELLS HAVING DIFFERENT PHASE CHANGE MATERIALS AND RELATED METHODS AND SYSTEMS

(75) Inventors: Dong-Ho Ahn, Gyeonggi-do (KR); Hideki Horii, Seoul (KR); Jun-Soo Bae, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 180 days.

(21) Appl. No.: 11/881,062

(22) Filed: Jul. 25, 2007

(65) Prior Publication Data

US 2008/0068879 A1 Mar. 20, 2008

(30) Foreign Application Priority Data

Sep. 20, 2006 (KR) .................. 10-2006-0091370

(51) Int. Cl.
*G11C 11/00* (2006.01)
(52) U.S. Cl. .................. 365/148; 365/175; 365/177
(58) Field of Classification Search ............ 365/148, 365/175, 177
See application file for complete search history.

(56) References Cited

U.S. PATENT DOCUMENTS

| | | | |
|---|---|---|---|
| 4,599,705 A | 7/1986 | Holmberg et al. |
| 4,653,024 A | 3/1987 | Young et al. |
| 4,820,394 A | 4/1989 | Young et al. |
| 4,845,533 A | 7/1989 | Pryor et al. |
| 4,924,436 A | 5/1990 | Strand |
| 5,124,232 A | 6/1992 | Nakanishi et al. |
| 5,166,758 A | 11/1992 | Ovshinsky et al. |
| 5,278,011 A | 1/1994 | Yamada et al. |
| 5,714,768 A | 2/1998 | Ovshinsky et al. |
| 5,811,816 A | 9/1998 | Gallagher et al. |
| 5,825,046 A | 10/1998 | Czubatyj et al. |
| 6,258,062 B1 | 7/2001 | Thielen et al. |

(Continued)

FOREIGN PATENT DOCUMENTS

JP 10340489 A 12/1998

(Continued)

OTHER PUBLICATIONS

Decision to Grant Patent issued by Korean Intellectual Property Office for Korean Application No. 10-2006-0091370, Jan. 9, 2008.

(Continued)

*Primary Examiner*—Hoai V Ho
(74) *Attorney, Agent, or Firm*—Myers Bigel Sibley & Sajovec, P.A.

(57) ABSTRACT

A phase change memory device may include an integrated circuit substrate and first and second phase change memory elements on the integrated circuit substrate. The first phase change memory element may include a first phase change material having a first crystallization temperature. The second phase change memory element may include a second phase change material having a second crystallization temperature. Moreover, the first and second crystallization temperatures may be different so that the first and second phase change memory elements are programmable at different temperatures. Related methods and systems are also discussed.

54 Claims, 13 Drawing Sheets

U.S. PATENT DOCUMENTS

| | | | |
|---|---|---|---|
| 6,381,967 B1 | 5/2002 | Craig | |
| 6,429,064 B1 | 8/2002 | Wicker | |
| 6,437,383 B1 | 8/2002 | Xu | |
| 6,507,061 B1 | 1/2003 | Hudgens et al. | |
| 6,586,761 B2 | 7/2003 | Lowrey | |
| 6,646,297 B2 | 11/2003 | Dennison | |
| 6,750,469 B2 | 6/2004 | Ichihara et al. | |
| 6,759,267 B2 | 7/2004 | Chen | |
| 6,774,388 B2 | 8/2004 | Hudgens et al. | |
| 6,815,704 B1 | 11/2004 | Chen | |
| 6,858,277 B1 | 2/2005 | Yamada et al. | |
| 6,858,454 B1 | 2/2005 | Kanzawa et al. | |
| 6,891,742 B2 | 5/2005 | Takano et al. | |
| 6,899,938 B2 | 5/2005 | Flynn | |
| 6,919,578 B2 | 7/2005 | Lowrey et al. | |
| 6,937,507 B2 * | 8/2005 | Chen | 365/163 |
| 7,037,762 B2 | 5/2006 | Joo et al. | |
| 7,049,623 B2 | 5/2006 | Lowrey | |
| 7,061,013 B2 | 6/2006 | Hideki | |
| 7,088,670 B2 | 8/2006 | Kondo | |
| 7,115,927 B2 | 10/2006 | Hideki et al. | |
| 7,205,562 B2 | 4/2007 | Wicker | |
| 2002/0072010 A1 | 6/2002 | Kubogata | |
| 2002/0081804 A1 | 6/2002 | Gill et al. | |
| 2002/0160553 A1 | 10/2002 | Yamanaka et al. | |
| 2003/0006535 A1 | 1/2003 | Hennessey et al. | |
| 2003/0122170 A1 | 7/2003 | Apodaca et al. | |
| 2003/0151041 A1 | 8/2003 | Chiang | |
| 2004/0012009 A1 | 1/2004 | Casagrande et al. | |
| 2004/0038445 A1 | 2/2004 | Lowrey et al. | |
| 2004/0106065 A1 | 6/2004 | Miyamoto et al. | |
| 2004/0113137 A1 | 6/2004 | Lowrey | |
| 2004/0114317 A1 | 6/2004 | Chiang et al. | |
| 2004/0115945 A1 | 6/2004 | Lowrey et al. | |
| 2004/0165422 A1 | 8/2004 | Hideki et al. | |
| 2004/0191683 A1 | 9/2004 | Nishihara et al. | |
| 2004/0248339 A1 | 12/2004 | Lung | |
| 2005/0002227 A1 | 1/2005 | Hideki et al. | |
| 2005/0019975 A1 | 1/2005 | Lee et al. | |
| 2005/0115829 A1 | 6/2005 | Yahagi et al. | |
| 2005/0227035 A1 | 10/2005 | Fuchioka et al. | |
| 2006/0072370 A1 | 4/2006 | Kuh et al. | |
| 2006/0087921 A1 | 4/2006 | Iwasaki | |
| 2006/0121391 A1 | 6/2006 | Khang et al. | |

FOREIGN PATENT DOCUMENTS

| | | |
|---|---|---|
| KR | 1019990067038 | 8/1999 |
| KR | 10-2004-0076225 A | 8/2004 |
| KR | 1020040078464 | 9/2004 |
| KR | 10-2005-0011609 A | 1/2005 |
| KR | 2001-0111276 A | 2/2005 |
| KR | 1020010111276 | 2/2005 |
| KR | 1020050059855 | 6/2005 |
| KR | 10-2005-0110680 A | 11/2005 |
| KR | 10-2006-0016312 A | 2/2006 |
| KR | 10-2006-0051652 A | 5/2006 |
| KR | 10-2006-0061745 A | 6/2006 |
| KR | 10-2006-0099158 A | 9/2006 |
| WO | WO97/15954 | 5/1997 |
| WO | WO 00/54982 A1 | 9/2000 |
| WO | WO03/009302 | 1/2003 |
| WO | WO 2004/084228 A1 | 9/2004 |

OTHER PUBLICATIONS

Notice to File Response/Amendment to the Examination Report, Korean Application No. 10-2004-0012358, Dec. 21, 2005.

Notice to File a Response/Amendment to the Examination Report corresponding to Korean Patent Application No. 10-2004-0012358 mailed May 24, 2006.

English Translation of Korean Office Action date Jul. 27, 2007 for Korean Application No. 10-2006-0091370.

Korean Office Action date Jul. 27, 2007 for Korean Application No. 10-2006-0091370.

* cited by examiner

FIG. 5

| Phase Change Material | Crystallization Temperature (℃) |
|---|---|
| InSb | 168 |
| $InGaSb_2$ | 249 |
| GaSb | 310 |
| $Ge_1 Sb_4 Te_7$ | 127 |
| $Ge_1 Sb_2 Te_4$ | 139 |
| $Ge_2 Sb_2 Te_5$ | 160 |
| GeTe | 182 |
| $Sb_2 Te$ | 103 |
| $Ge_{15} Sb_{85}$ | 300 |

PHASE CHANGE MEMORY DEVICES INCLUDING MEMORY CELLS HAVING DIFFERENT PHASE CHANGE MATERIALS AND RELATED METHODS AND SYSTEMS

RELATED APPLICATIONS

This U.S. non-provisional patent application claims priority under 35 U.S.C. § 119 of Korean Patent Application No. 10-2006-0091370, filed on Sep. 20, 2006, the disclosure of which is hereby incorporated herein by reference in its entirety.

FIELD OF THE INVENTION

The present invention generally relates to memory devices, and more particularly, to phase change memory devices and related methods.

BACKGROUND

In a Phase change Random Access Memory (PRAM) device, a state of a phase change material may be used to store information thereby providing non-volatile memory. Phase change materials may exhibit at least two different states, referred to as the amorphous and crystalline states. Transitions between the amorphous and crystalline states may be selectively initiated, for example, using current induced temperature cycles. The states may be distinguished because the amorphous state generally exhibits a higher resistivity than the crystalline state. The amorphous state may have a more disordered atomic structure, and the crystalline state may have a more ordered atomic structure. Generally, any phase-change material may be used in a phase change memory device, but thin-film chalcogenide alloy materials have been found to be particularly suitable.

In a phase change memory device, the phase of a phase change material in a memory cell may be reversibly changed back and forth between the amorphous and crystalline states. In effect, each phase change memory cell may be a programmable resistor that reversibly changes between higher and lower resistance states in response to temperature cycles induced by resistive heating. Phase change memory devices are discussed, for example, in U.S. Pat. No. 6,507,061.

SUMMARY

According to some embodiments of the present invention, a phase change memory device may include an integrated circuit substrate, and first and second phase change memory elements of the integrated circuit substrate. The first phase change memory element may include a first phase change material having a first crystallization temperature. The second phase change memory element may include a second phase change material having a second crystallization temperature. Moreover, the first and second crystallization temperatures may be different so that the first and second phase change memory elements are programmable at different temperatures.

The second phase change memory element may be free of the first phase change material. The first phase change memory element may be free of the second phase change material, or the first phase change memory element may include a first layer of the first phase change material and a second layer of the second phase change material. If the first phase change memory element includes layers of the first and second phase change materials, a barrier layer (such as a layer of titanium and/or titanium nitride) may be between the first layer of the first phase change material and the second layer of the second phase change material.

The first crystallization temperature may be at least 50 degrees C. greater than the second crystallization temperature, and more particularly, the first crystallization temperature may be at least 100 degrees C. greater than the second crystallization temperature. The first and second phase change materials may comprise different chalcogenide materials. For example, the first phase change material may be selected from the group consisting of GaSb, InGaSb$_2$, and/or Ge$_{15}$Sb$_{85}$, the second phase change material may be selected from the group consisting of InSb, InGaSb$_2$, Ge$_1$Sb$_4$Te$_7$, Ge$_1$Sb$_2$Te$_4$, Ge$_2$Sb$_2$Te$_5$, GeTe, and/or Sb$_2$Te, and the first and second phase change materials may be different.

In addition, a third phase change memory element may be provided on the integrated circuit substrate, with the third phase change memory element including a third phase change material having a third crystallization temperature. The third crystallization temperature may be different than the first and second crystallization temperatures so that the first, second, and third phase change memory elements are programmable at different temperatures.

A first diode may be electrically coupled in series with the first phase change memory element between a first word line and a first bit line, and a second diode may be electrically coupled in series with the second phase change memory element between a second word line and a second bit line. In other alternative embodiments, the first phase change memory element may be electrically coupled between a first bit line and a terminal of a first memory access transistor, and the second phase change memory element may be electrically coupled between a second bit line and a terminal of a second memory access transistor. In still other alternative embodiments, a diode may be electrically coupled in series with the first phase change memory element between a first word line and a first bit line, and the second phase change memory element may be electrically coupled between a second bit line and a terminal of a memory access transistor.

In addition, an electronic substrate may be electrically and mechanically coupled (for example, using solder bumps) to the integrated circuit substrate, and a processor may be electrically coupled to the integrated circuit substrate through the electronic substrate. Moreover, the first crystallization temperature may be higher than the second crystallization temperature, the processor may be configured to read data from the first phase change memory element without writing data to the first phase change memory element, and the processor may be configured to write data to and read data from the second phase change memory element.

According to some other embodiments of the present invention, a method of forming a phase change memory device may include forming first and second phase change memory elements on an integrated circuit substrate. The first phase change memory element may be formed on a first memory region of an integrated circuit substrate, and the first phase change memory element may include a first phase change material having a first crystallization temperature. The second phase change memory element may be formed on a second memory region of the integrated circuit substrate, and the second phase change memory element may include a second phase change material having a second crystallization temperature. Moreover, the first and second crystallization temperatures may be different so that the first and second phase change memory elements are programmable at different temperatures.

Forming the first phase change memory element may include forming a layer of the first phase change material on the first memory region with the second memory region being free of the layer of the first phase change material, and forming the second phase change memory element may include forming a layer of the second phase change material on the second memory region after forming the layer of the first phase change material. Forming the layer of the first phase change material may include forming the layer of the first phase change material on the first and second memory regions, and removing portions of the layer of the first phase change material from the second memory region while maintaining portions of the layer of the first phase change material on the first memory region.

Forming the layer of the second phase change material may include forming the layer of the second phase change material on the second memory region and on the layer of the first phase change material on the first memory region, and removing portions of the layer of the second phase change material between the first and second memory regions while maintaining portions of the layer of second phase change material on the second memory region. Removing portions of the layer of the second phase change material may include removing portions of the layer of the second phase change material from the layer of the first phase change material on the first memory region. In alternative embodiments, removing portions of the layer of the second phase change material may include maintaining portions of the second phase change material on the layer of the first phase change material on the first memory region. Before forming the layer of the second phase change material, a barrier layer (such as a layer of titanium and/or titanium nitride) may be formed on the layer of the first phase change material so that the barrier layer is between the first layer of the first phase change material and the second layer of the second phase change material in the first memory region.

The first crystallization temperature may be at least 50 degrees C. greater than the second crystallization temperature, and more particularly, the first crystallization temperature may be at least 100 degrees C. greater than the second crystallization temperature. The first and second phase change materials may comprise different chalcogenide materials. For example, the first phase change material may be selected from the group consisting of GaSb, InGaSb$_2$, and/or Ge$_{15}$Sb$_{85}$, the second phase change material may be selected from the group consisting of InSb, InGaSb$_2$, Ge$_1$Sb$_4$Te$_7$, Ge$_1$Sb$_2$Te$_4$, Ge$_2$Sb$_2$Te$_5$, GeTe, and/or Sb$_2$Te, and the first and second phase change materials may be different.

In addition, a third phase change memory element may be formed on the integrated circuit substrate, the third phase change memory element may include a third phase change material having a third crystallization temperature, and the third crystallization temperature may be different than the first and second crystallization temperatures so that the first, second, and third phase change memory elements are programmable at different temperatures.

Before forming the first and second phase change memory elements, first and second diodes may be formed in the respective first and second memory regions so that the first diode is electrically coupled between the first phase change memory element and a first word line and the second diode is electrically coupled between the second phase change memory element and a second word line. In alternative embodiments, before forming the first and second phase change memory elements, first and second memory access transistors may be formed in the respective first and second memory regions so that the first phase change memory element is electrically coupled to a terminal of the first memory access transistor and the second phase change memory element is electrically coupled to a terminal of the second memory access transistor. In other alternative embodiments, before forming the first phase change memory element, a diode may be formed in the first memory region so that the diode is electrically coupled in series with the first phase change memory element between a first word line and a first bit line, and a memory access transistor may be formed in the second memory region so that the second phase change memory element is electrically coupled between a second bit line and a terminal of the memory access transistor.

The first crystallization temperature may be higher than the second crystallization temperature, and after forming the first and second phase change memory elements, the first phase change memory element may be programmed. After programming the first phase change memory element, the integrated circuit substrate may be electrically and mechanically coupled to an electronic substrate so that a processor is electrically coupled to the integrated circuit substrate through the electronic substrate. Electrically and mechanically coupling the integrated circuit substrate to the electronic substrate may include reflowing solder and a reflow temperature of the solder may be less than the first crystallization temperature. Moreover, the reflow temperature of the solder may be greater than the second crystallization temperature. In addition, the processor may be configured to read data from the first phase change memory element without writing data to the first phase change memory element, and the processor may be configured to write data to and read data from the second phase change memory element.

According to still other embodiments of the present invention, an electronic system may include an electronic substrate, a phase change memory device electrically and mechanically coupled to the electronic substrate, and a processor electrically coupled to the electronic substrate. The phase change memory device may include a first phase change memory element on an integrated circuit substrate, and the first phase change memory element may include a first phase change material having a first crystallization temperature. The phase change memory device may also include a second phase change memory element on the integrated circuit substrate, and the second phase change memory element may include a second phase change material having a second crystallization temperature. Moreover, the first and second crystallization temperatures may be different so that the first and second phase change memory elements are programmable at different temperatures. In addition, the processor and the phase change memory device may be electrically coupled through the electronic substrate.

The first crystallization temperature may be at least 50 degrees C. greater than the second crystallization temperature, and more particularly, the first crystallization temperature may be at least 100 degrees C. greater than the second crystallization temperature. For example, the first and second phase change materials may comprise different chalcogenide materials. Moreover, the processor may be configured to read data from the first phase change memory element without writing data to the first phase change memory element, and the processor may be configured to write data to and read data from the second phase change memory element.

According to yet other embodiments of the present invention, an electronic system may include an electronic substrate, first and second phase change memory devices electrically and mechanically coupled to the electronic substrate, and a processor electrically coupled to the electronic substrate. The first phase change memory device may include a plurality of first phase change memory elements on a first integrated circuit substrate, and each of the first phase change memory elements may include a first phase change material having a first crystallization temperature. The second phase change memory device may include a plurality of second phase change memory elements on a second integrated circuit substrate, and each of the second phase change memory elements may include a second phase change material having a second crystallization temperature. Moreover, the first and second crystallization temperatures may be different so that the first and second phase change memory elements are programmable at different temperatures. In addition, the processor and the first and second phase change memory devices may be electrically coupled through the electronic substrate.

The first crystallization temperature may be at least 50 degrees C. greater than the second crystallization temperature, and more particularly, the first crystallization temperature may be at least 100 degrees C. greater than the second crystallization temperature. For example, the first and second phase change materials may comprise different chalcogenide materials. The processor may be configured to read data from the first phase change memory device without writing data to the first phase change memory device, and the processor may be configured to write data to and read data from the second phase change memory device.

According to still more embodiments of the present invention, an electronic system may include a first plurality of phase change memory elements each including a first phase change material having a first crystallization temperature, and a second plurality of phase change memory elements each including a second phase change material having a second crystallization temperature. The first and second crystallization temperatures may be different so that the first and second pluralities of phase change memory elements are programmable at different temperatures. In addition, a processor may be electrically coupled to the first and second pluralities of phase change memory elements. A method of operating such an electronic system may include reading ROM data from the first plurality of phase change memory elements to the processor without writing the ROM data from the processor to the first plurality of phase change memory elements. Moreover, programmable data may be written from the processor to the second plurality of phase change memory elements, and after writing the programmable data, the programmable data may be read from the second plurality of phase change memory elements to the processor.

The first crystallization temperature may be at least 50 degrees C. greater than the second crystallization temperature, and/or the first and second phase change materials may include different chalcogenide materials. Moreover, the first and second pluralities of phase change memory elements may be provided on a same semiconductor integrated circuit substrate, or the first and second pluralities of phase change memory elements may be provided on respective first and second semiconductor integrated circuit substrates.

According to yet more embodiments of the present invention, an electronic system may include a first plurality of phase change memory elements each including a first phase change material having a first crystallization temperature, and a second plurality of phase change memory elements each including a second phase change material having a second crystallization temperature. The first and second crystallization temperatures may be different so that the first and second pluralities of phase change memory elements are programmable at different temperatures. A processor may be electrically coupled to the first and second pluralities of phase change memory elements. More particularly, the processor is configured to read ROM data from the first plurality of phase change memory elements without writing the ROM data from the processor to the first plurality of phase change memory elements. The processor may also be configured to write programmable data to the second plurality of phase change memory elements, and to read the programmable data from the second plurality of phase change memory elements after writing the programmable data.

The first crystallization temperature may be at least 50 degrees C. greater than the second crystallization temperature, and/or the first and second phase change materials may include different chalcogenide materials. Moreover, the first and second pluralities of phase change memory elements may be provided on a same semiconductor integrated circuit substrate, or the first and second pluralities of phase change memory elements may be provided on respective first and second semiconductor integrated circuit substrates.

BRIEF DESCRIPTION OF THE DRAWINGS

FIG. 5 is a table of chalcogenide materials and respective crystallization temperatures (in degrees C.).

DETAILED DESCRIPTION

Figure 1:
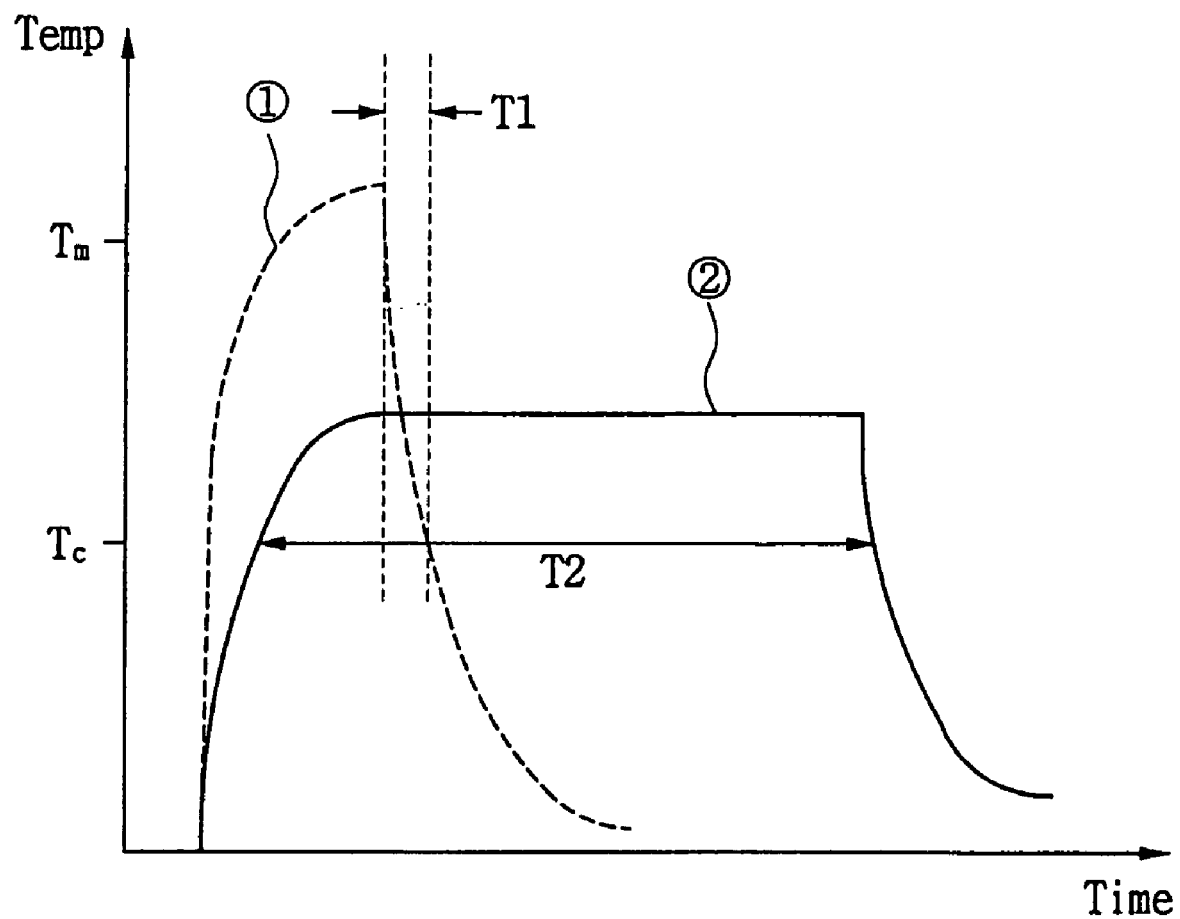
FIG. 1 is a graph illustrating characteristics of phase change materials used in phase change memory cells.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIG. 1 is a graph illustrating characteristics of a phase change material with the horizontal axis denoting time Time and the vertical axis denoting temperature Temp as applied to the phase change material. With reference to FIG. 1, if the phase change material is heated to a temperature higher than its melting temperature Tm and then quickly cooled below its crystallization temperature Tc over a relatively short quench time T1, a programmable volume of the phase change material may become amorphous as shown by curve 1 (dashed line). If the phase change material is heated to a temperature lower than its melting temperature Tm and higher than its crystallization temperature Tc over a second duration T2 (longer than T1) and then cooled, the programmable volume of the phase change material may become crystalline as shown by curve 2 (solid line). A resistance of the amorphous-state material may be higher than a resistance of the crystalline-state material.

In a read mode, a current flowing through the phase change material may thus be used to determine whether information stored in a phase change memory element is a logic "1" or a logic "0." With $Ge_2Sb_2Te_5$, for example, the crystallization temperature Tc may be about 160 degrees C., the melting temperature Tm may be about 610 degrees C., the quench time T1 used to set the amorphous state may be in the range of about 4 ns to about 5 ns, and the duration T2 used to set the crystalline state may be about 500 ns. Operations of phase change memory cells are discussed, for example, in U.S. Pat. No. 7,061,013 to Horii Hideki, the disclosure of which is hereby incorporated herein in its entirety by reference.

According to some embodiments of the present invention, random access memory (RAM) and read only memory (ROM) regions of a same phase change memory device (on a same semiconductor substrate) may include memory elements with different phase change materials having different crystallization temperatures. More particularly, a ROM region of the phase change memory device may include memory elements using a phase change material having a relatively high crystallization temperature, and a RAM region of the phase change memory device may include memory elements using a phase change material having a relatively low crystallization temperature.

Accordingly, the ROM region of the phase change memory device may be programmed before packaging the device without erasing ROM data during subsequent high temperature packaging operations. For example, the phase change material of the ROM region may be selected to have a crystallization temperature greater than a temperature of any operations (such as solder reflow) used during packaging. A crystallization temperature of the phase change material of the RAM region may be less than a temperature of one or more packaging operations because the RAM region of the phase change memory device may remain unprogrammed until after packaging. The ROM region of the memory device may thus be efficiently programmed before packaging without erasing the ROM data during packaging while a phase change material having a lower crystallization temperature may provide faster and/or lower power write operations in the RAM region.

Figure 2:
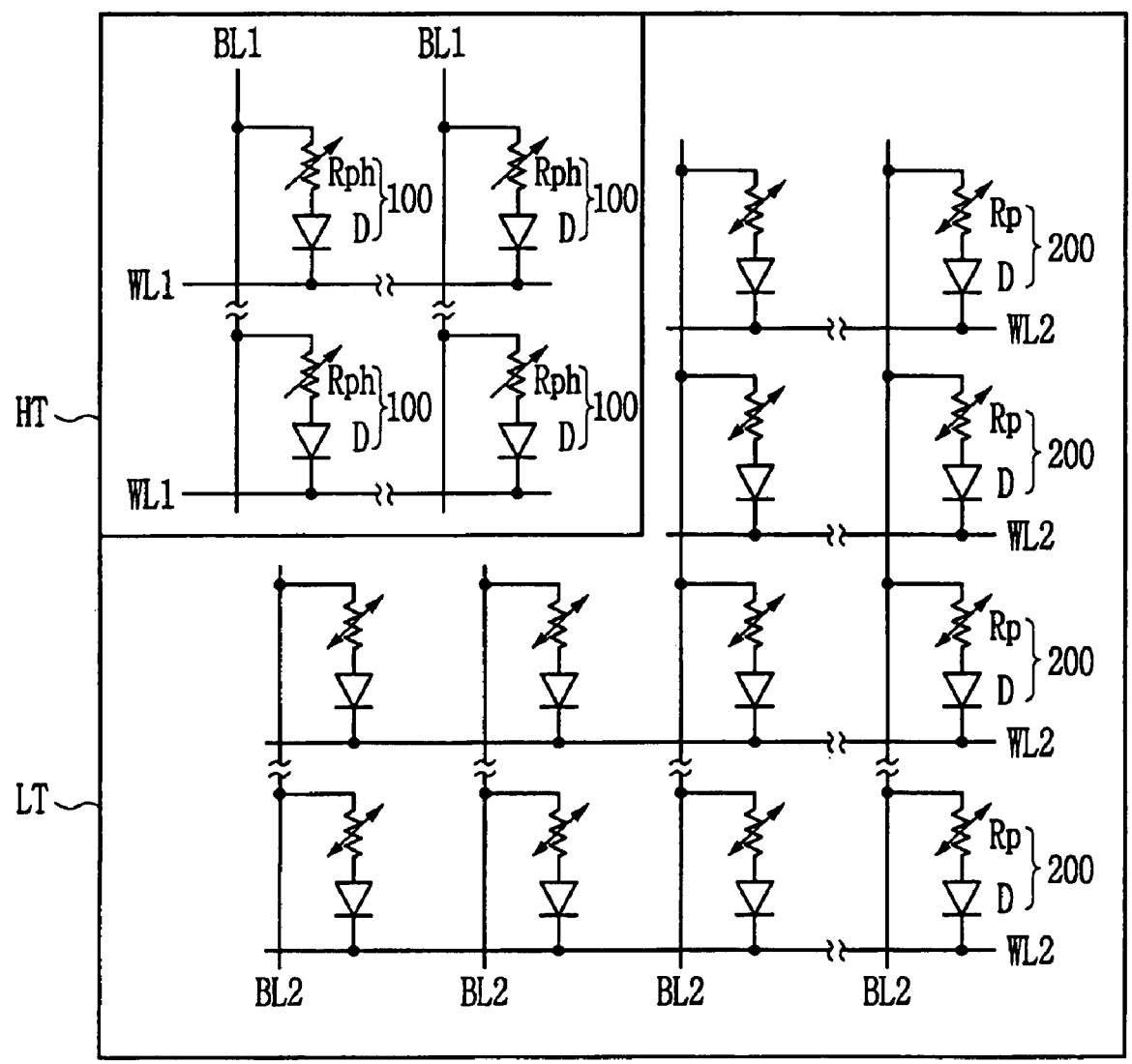
FIG. 2 is a schematic diagram illustrating a layout of a phase change memory device including high temperature and low temperature memory cell regions according to some embodiments of the present invention.

FIG. 2 is a schematic diagram illustrating a layout of a phase change memory device including high temperature and low temperature memory cell regions according to some embodiments of the present invention. As shown in FIG. 2, a phase change memory cell may include a variable resistor Rph (including a high temperature phase change layer) or Rp (including a low temperature phase change layer). Accordingly, each high temperature memory cell 100 in a high temperature region HT of the memory device may include a layer of a relatively high crystallization temperature phase change material (variable resistor Rph also referred to as a memory element) electrically connected in series with a diode D between a bit line BL1 and a word line WL1. Similarly, each low temperature memory cell 200 in a low temperature region LT of the memory device may include a layer of a relatively low crystallization temperature phase change material (variable resistor Rp also referred to as a memory element) connected in series with a diode D between a bit line BL2 and a word line WL2.

Figure 3:
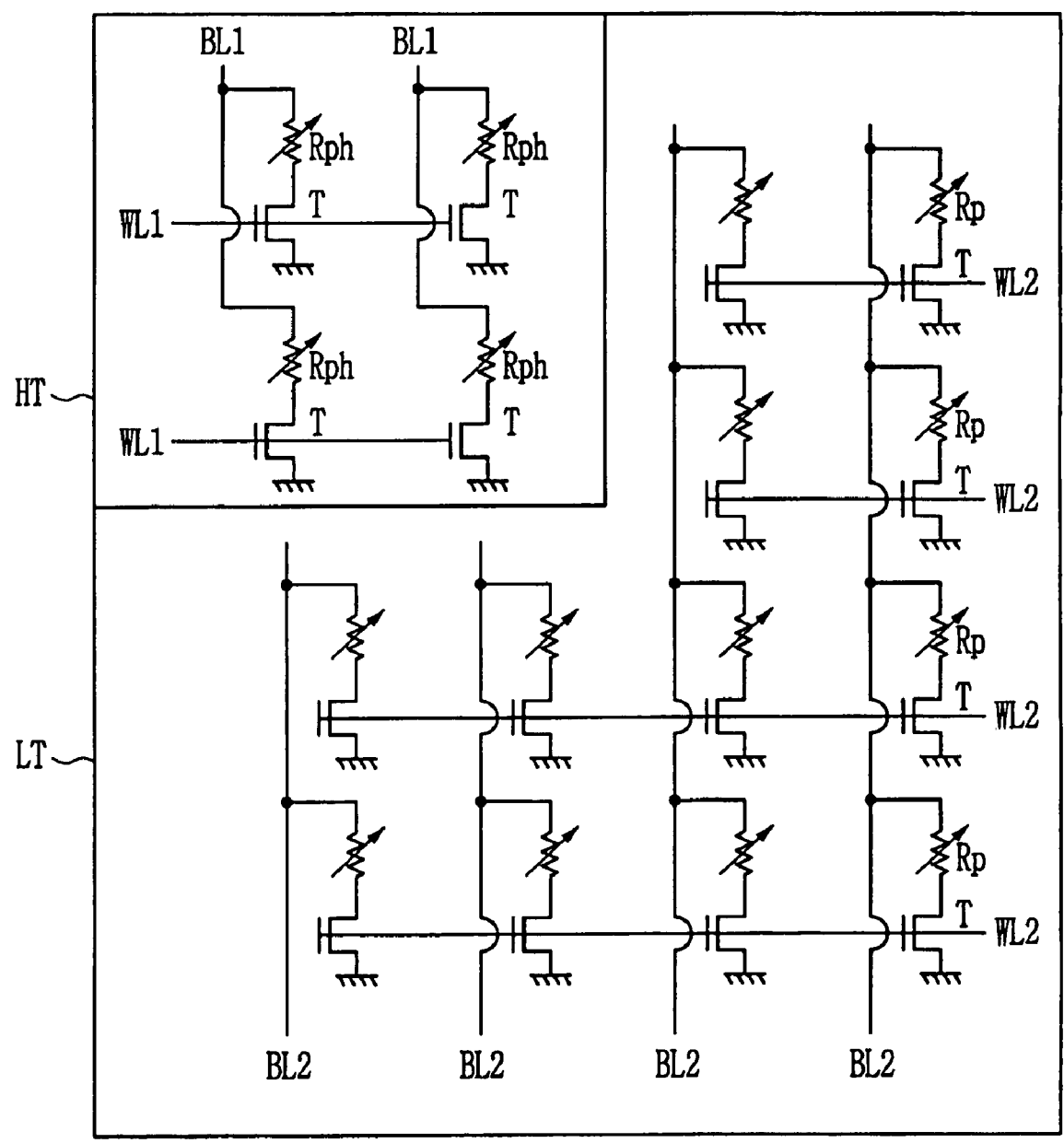
FIG. 3 is a schematic diagram illustrating a layout of a phase change memory device including high temperature and low temperature memory cell regions according to some other embodiments of the present invention.

FIG. 3 is a schematic diagram illustrating a layout of a phase change memory device including high temperature and low temperature memory cell regions according to some other embodiments of the present invention. As shown in FIG. 3, a phase change memory cell may include a variable resistor Rph (including a high temperature phase change layer) or Rp (including a low temperature phase change layer). Accordingly, each high temperature memory cell in a high temperature region HT of the memory device may include a layer of a relatively high crystallization temperature phase change material (variable resistor Rph also referred to as a memory element) electrically connected in series with a transistor T between a bit line BL1 and a source line (represented as ground), and a gate of each transistor T may be coupled to a word line WL1. Similarly, each low temperature memory cell 200 in a low temperature region LT of the memory device may include a layer of a relatively low crystallization temperature phase change material (variable resistor Rp also referred to as a memory element) connected in series with a transistor T between a bit line BL2 and a source line (represented as ground), and a gate of each transistor T may be coupled to a word line WL2.

Figure 4:
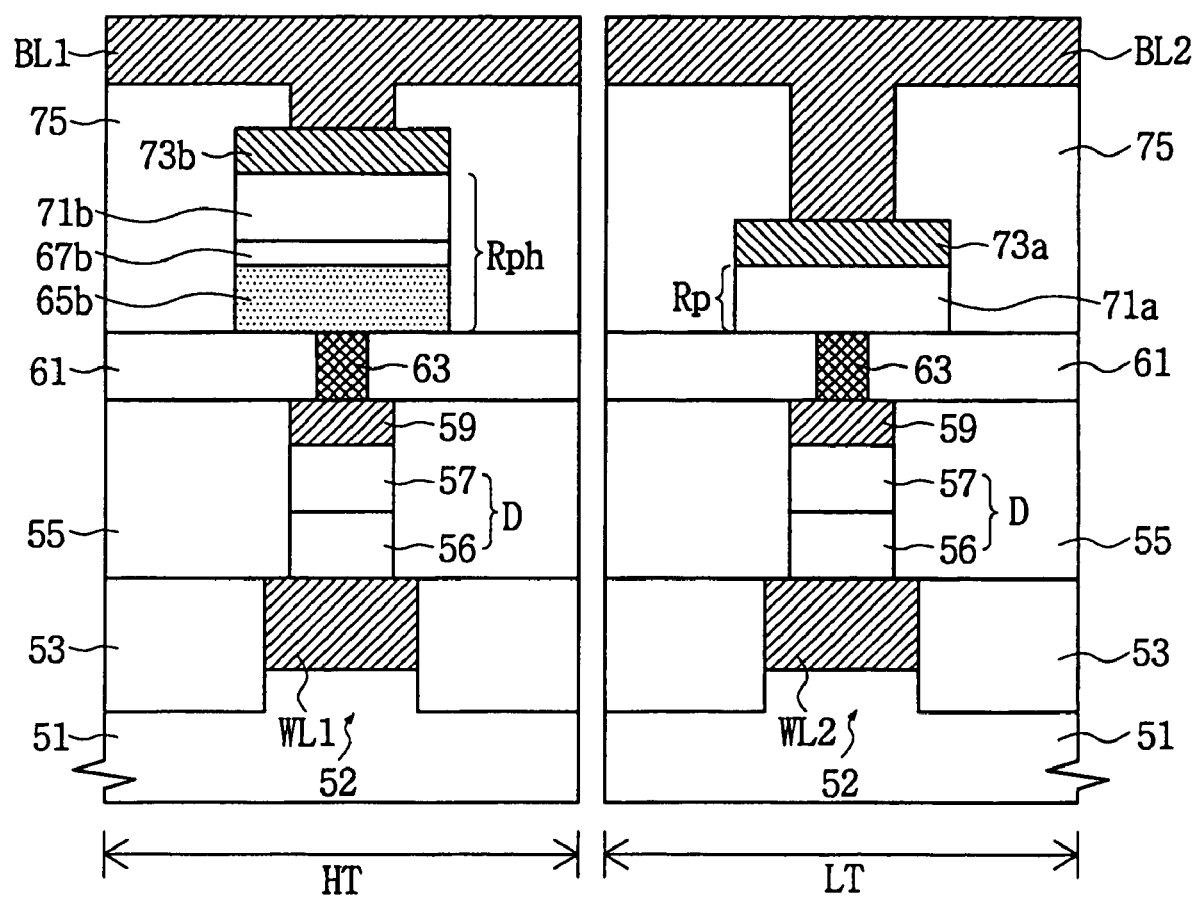
FIG. 4 is a cross sectional view illustrating respective high and low temperature memory elements of the phase change memory device of FIG. 2 according to some embodiments of the present invention.

FIG. 4 is a cross sectional view illustrating high and low temperature memory cells in respective high temperature HT and low temperature LT regions of the phase change memory device of FIG. 2. As discussed above, high temperature memory cells in the high temperature region HT may provide read only memory (ROM) that is programmed before packaging (e.g., before flip-chip soldering to a printed circuit board), and low temperature memory cells in the low temperature region LT may provide random access memory (RAM) that is programmed after packing (e.g., after flip-chip soldering to a printed circuit board).

As shown in FIG. 4, word lines WL1 and WL2 may be provided as doped regions of a semiconductor substrate 52, and the word lines may be isolated using insulating field regions 53 (such as field oxide regions). While the word lines are shown as doped regions of a semiconductor substrate, word lines may be provided using other conductive patterns such as metal patterns, doped polysilicon patterns, silicide patterns, etc. An interlayer dielectric (ILD) layer 55 (such as a layer of silicon oxide) may be provided on the word lines WL1 and WL2, and contact holes may be formed in the ILD layer 55. Doped polysilicon layers 56 and 57 of opposite conductivity types in the contact holes may provide diodes D, and diode electrodes 59 (such as silicide electrodes) may be provided on the diodes D in the contact holes as shown in FIGS. 2 and 4. More particularly, the diode electrodes 59 may include nickel silicide and/or copper silicide.

An interlayer dielectric (ILD) layer 61 (such as a layer of silicon oxide) may be formed on the diode electrodes 59 and on the ILD layer 55, and contact holes may be formed through the ILD layer 61 exposing portions of the diode electrodes 63. Bottom electrode contacts (BECs) 63 may be formed in the contact holes through the ILD layer 61, and the BECs 63 may include one or more conductive materials such as TiN, TIAlN, TiBN, TiSiN, TaN, TaAlN, TaBN, TaSiN, WN, WBN, WSiN, WAlN, ZrN, ZrSiN, ZrAlN, ZrBN, MoN, Al, Al—Cu, Al—Cu—Si, WSi$_x$, Ti, W, Mo, Ta, TiW, and/or Cu.

As shown in FIG. 4, a low temperature phase change memory element Rp may include a layer of a low temperature phase change material 71a, and an upper electrode 73a may be provided on the low temperature phase change memory element Rp. A high temperature phase change memory element Rph may include a layer of a high temperature phase change material 65b, a barrier layer 67b (for example, including Ti and/or TiN), and a layer of the low temperature phase change material 71b, and an upper electrode 73b may be provided on the high temperature phase change memory element Rph. More particularly, the low temperature phase change material may have a crystallization temperature that is lower than a crystallization temperature of the high temperature phase change material. An interlayer dielectric (ILD) 75 may be formed on the phase change memory elements Rp and Rph and upper electrodes 73a and 73b, and contact holes in the ILD 75 may expose portions of the upper electrodes 73a and 73b. The bit lines BL1 and BL2 may be formed on the ILD 75 and on exposed portions of the upper electrodes 73a and 73b.

The upper electrodes 73a and 73b may include TiN, TiAlN, TiBN, TiSiN, TaN, TaAlN, TaBN, TaSiN, WN, WBN, WSiN, WAlN, ZrN, ZrSiN, ZrAlN, ZrBN, MoN, Al, Al—Cu, Al—Cu—Si, WSi$_x$, Ti, W, Mo, Ta, TiW, and/or Cu. Moreover, the bitlines BL1 and BL2 may include aluminum, tungsten, and/or copper. By providing that a contact area between the BECs 63 and the respective phase change memory elements Rp and Rph is small relative to a contact area between the upper electrodes 73a and 73b and the respective phase change memory elements Rp and Rph, heating (and resulting phase change) during programming operations may occur in portions of the memory elements Rp and Rph primarily adjacent the BECs 63. Accordingly, inclusion of the layer of the low temperature phase change material 71b in the high temperature phase change memory element Rph may not significantly affect programming of the high temperature phase change memory element Rph. Stated in other words, a programmable volume of the high temperature phase change memory element Rph may be confined to the layer of the high temperature phase change material 65b. The low temperature phase change memory element Rp may thus be programmable at a relatively low temperature, and the high temperature phase change memory element Rph may be programmable at a relatively high temperature.

A crystallization temperature of the high temperature phase change material (used in layer 65b) may be at least about 50 degrees C. higher than a crystallization temperature of the low temperature phase change material (used in layers 71a and 71b). More particularly, a crystallization temperature of the high temperature phase change material may be at least about 100 degrees C. higher than a crystallization temperature of the low temperature phase change material.

The low temperature phase change material may be a layer of a first chalcogenide material having a relatively low crystallization temperature, and the high temperature phase change material may be a layer of a second chalcogenide material having a relatively high crystallization temperature. Examples of different chalcogenide materials and their respective crystallization temperatures (in degrees C.) are provided in the table of FIG. 5. According to some embodiments of the present invention, the high temperature phase change material (used for layer 65b) may be selected from the group consisting of GaSb, InGaSb$_2$, and/or Ge$_{15}$Sb$_{85}$, and the low temperature phase change material (used for layers 71a and 71b) may be selected from the group consisting of InSb, InGaSb$_2$, Ge$_1$Sb$_4$Te$_7$, Ge$_1$Sb$_2$Te$_4$, Ge$_2$Sb$_2$Te$_5$, GeTe, and/or Sb$_2$Te, with the high and low temperature phase change materials being different.

Figure 6:
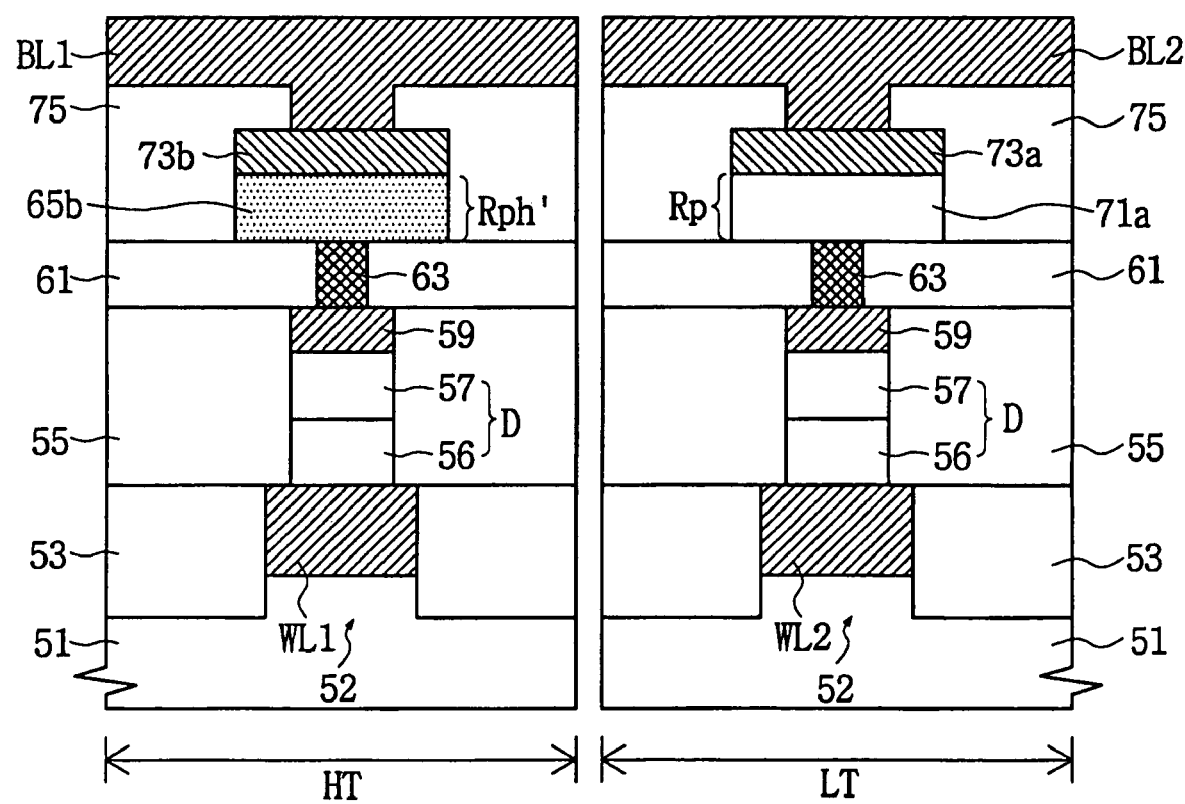
FIG. 6 is a cross sectional view illustrating respective high and low temperature memory elements of the phase change memory device of FIG. 2 according to some other embodiments of the present invention.

As shown in FIG. 4, the low temperature phase change memory element Rp may be free of the high temperature phase change material, while the high temperature phase change memory element Rph may include layers of both the high temperature phase change material and the low temperature phase change material. According to other embodiments of the present invention shown in FIG. 6, the high temperature phase change memory element Rph may be free of the low temperature phase change material. In FIG. 6, the BECs 63, the ILD 61, and elements below the BECs 63 and ILD 61 are the same as discussed above with respect to FIG. 4 and will, thus, not be discussed further. In addition, the low temperature phase change memory element Rp (including the layer of the low temperature phase change material 71a), the upper electrodes 73a and 73b, the ILD 75, and the bit lines BL1 and BL2 are the same as discussed above with respect to FIG. 4 and will, thus, not be discussed further herein. As shown in FIG. 6, however, the high temperature phase change memory element Rph' may include the layer of the high temperature phase change material 65b without a barrier layer and/or a layer of the low temperature phase change material. The layer of the high temperature phase change material 65b may be the same as discussed above with respect to FIG. 4.

As shown in FIGS. 4 and 6, high and low temperature phase change memory elements Rph (or Rph') and Rp may provide programming at two different temperatures determined by the different crystallization temperatures of the high and low temperature phase change materials. Phase change memory elements may provide programming at any number of different temperatures using a corresponding number of phase change memory materials having different crystallization temperatures.

Figure 7:
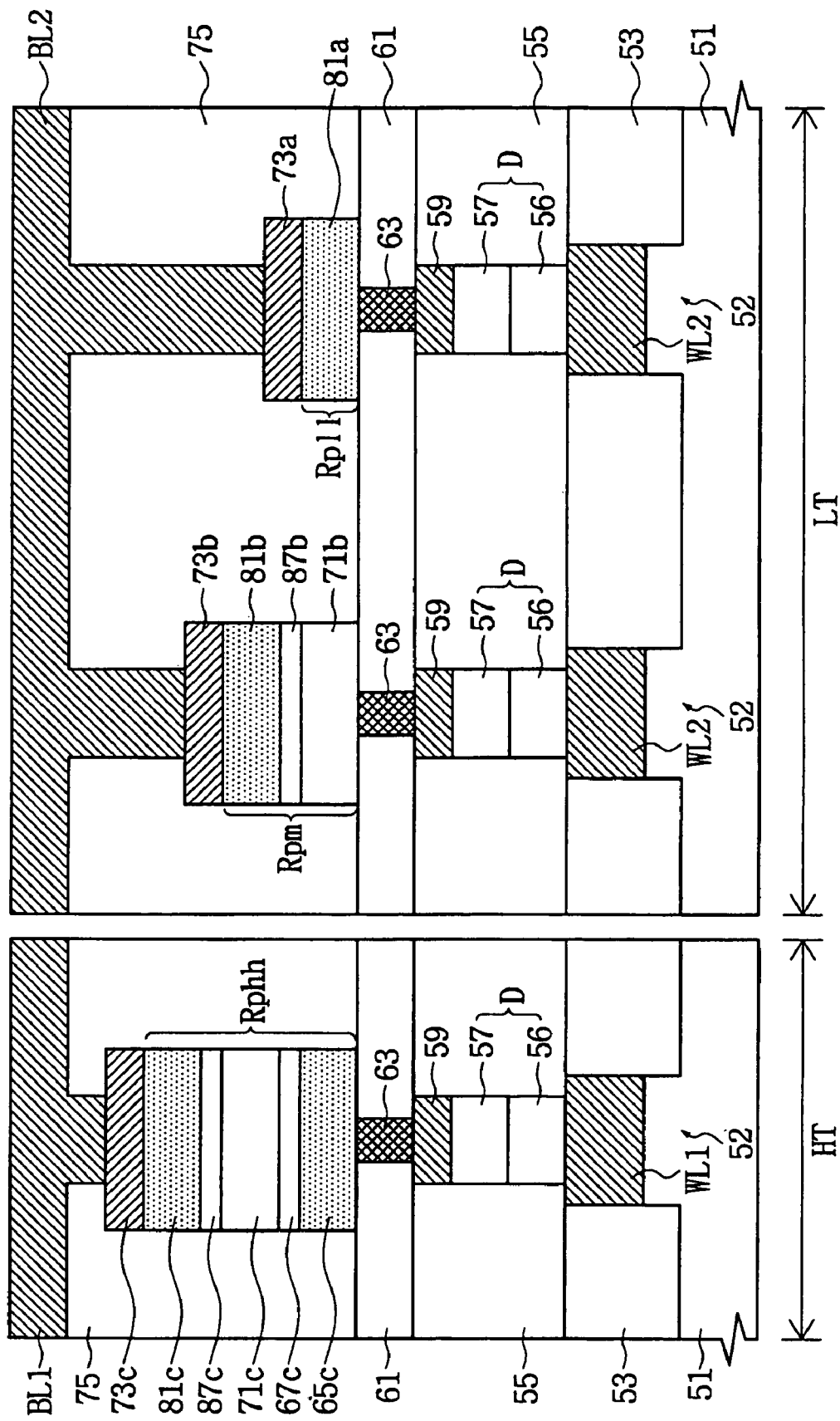
FIG. 7 is a cross sectional view illustrating respective high, medium, and low temperature memory elements in a phase change memory device according to still other embodiments of the present invention.

As shown in FIG. 7, a same memory device (on a same semiconductor substrate 52) may include high, medium, and low temperature phase change memory elements Rphh, Rpm, and Rpll. The low temperature phase change memory element Rpll may include a layer of a low temperature phase change material 81a. The medium temperature phase change memory element Rpm may include a layer of a medium temperature phase change material 71b, a barrier layer 87b (for example, including Ti and/or TiN), and a layer of the low temperature phase change material 81b. The high temperature phase change memory element Rphh may include a layer of a high temperature phase change material 65c, a barrier layer 67c (for example, including Ti and/or TiN), a layer of the medium temperature phase change material 71c, a barrier layer 87c (for example, including Ti and/or TiN), and a layer of the low temperature phase change material 81c.

In FIG. 7, the BECs 63, the ILD 61, and elements below the BECs 63 and ILD 61 are the same as discussed above with respect to FIGS. 4 and 6 and will, thus, not be discussed further. In addition, the upper electrodes 73a, 73b, and 73c, and the ILD 75, and the bit lines BL1 and BL2 are the same as discussed above with respect to corresponding elements of FIGS. 4 and 6 and will, thus, not be discussed further herein. While the medium and low temperature phase change memory elements Rpm and Rpll shown in FIG. 7 sharing a same bit line BL2, the medium and low temperature phase change memory elements Rpm and Rpll may be coupled to different bit lines.

By providing that a contact area between the BECs 63 and the respective phase change memory elements Rphh, Rpm, and Rpll is small relative to a contact area between the upper electrodes 73c, 73b, and 73c and the respective phase change memory elements Rp and Rph, heating (and resulting phase change) during programming operations may occur in portions of the memory elements Rphh, Rpm, and Rpll primarily adjacent the BECs 63. Accordingly, inclusion of the layers of the low and medium temperature phase change materials 81c and 71c in the high temperature phase change memory element Rphh may not significantly affect programming of the high temperature phase change memory element Rphh. Similarly, inclusion of the layers of the low temperature phase change material 81b in the medium temperature phase change memory element Rpm may not significantly affect programming of the medium temperature phase change memory element Rpm.

Stated in other words, a programmable volume of the high temperature phase change memory element Rphh may be confined to the layer of the high temperature phase change material 65c, and a programmable volume of the medium temperature phase change memory element Rpm may be confined to the layer of the medium temperature phase change material 71b. The low temperature phase change memory element Rpll may thus be programmable at a relatively low temperature, the medium temperature phase change memory element Rpm may be programmable at a medium temperature, and the high temperature phase change memory element Rphh may be programmable at a relatively high temperature.

A crystallization temperature of the high temperature phase change material (used in layer 65c) may be at least about 50 degrees C. higher than a crystallization temperature of the medium temperature phase change material (used in layers 71b and 71c). In addition, a crystallization temperature of the medium temperature phase change material (used in layers 71b and 71c) may be at least about 50 degrees C. higher than a crystallization temperature of the low temperature phase change material (used in layers 81a, 81b, and 81c).

The low temperature phase change material may be a layer of a first chalcogenide material having a relatively low crystallization temperature, the high temperature phase change material may be a layer of a second chalcogenide material having a relatively high crystallization temperature, and the medium temperature phase change material may be a layer of a third chalcogenide material having a medium crystallization temperature between the crystallization temperatures of the low and high temperature phase change materials. Examples of different chalcogenide materials and their respective crystallization temperatures (in degrees C.) are provided in the table of FIG. 5.

According to some embodiments of the present invention, the high temperature phase change material (used for layer 65c) may be selected from the group consisting of GaSb, InGaSb$_2$, and/or Ge$_{15}$Sb$_{85}$; the medium temperature phase change material (used for layers 71b and 71c) may be selected from the group consisting of InSb, InGaSb$_2$, Ge$_2$Sb$_2$Te$_5$, and/or GeTe; and the low temperature phase change material (used for layers 81a, 81b, and 71b) may be selected from the group consisting of InSb, Ge$_1$Sb$_4$Te$_7$, Ge$_1$Sb$_2$Te$_4$, Ge$_2$Sb$_2$Te$_5$, GeTe, and/or Sb$_2$Te; with the high, medium, and low temperature phase change materials being different. According to some embodiments of the present invention, the high temperature phase change material (used for layer 65c) may be selected from the group consisting of GaSb and/or Ge$_{15}$Sb$_{85}$; the medium temperature phase change material (used for layers 71b and 71c) may be selected from the group consisting of InSb, InGaSb$_2$, Ge$_2$Sb$_2$Te$_5$, and/or GeTe; and the low temperature phase change material (used for layers 81a, 81b, and 71b) may be selected from the group consisting of Ge$_1$Sb$_4$Te$_7$, Ge$_1$Sb$_2$Te$_4$, and/or Sb$_2$Te.

As shown in FIG. 7, the low temperature phase change memory element Rpll may be free of the medium and high temperature phase change materials, and the medium temperature phase change memory element Rpm may be free of the high temperature phase change material, while the high temperature phase change memory element Rphh may include layers of the low, medium, and high temperature phase change materials. According to other embodiments of the present invention shown in FIG. 8, the high temperature phase change memory element Rphh' may be free of the low and medium temperature phase change materials, and the medium temperature phase change memory element Rpm' may be free of the low temperature phase change material.

Figure 8:
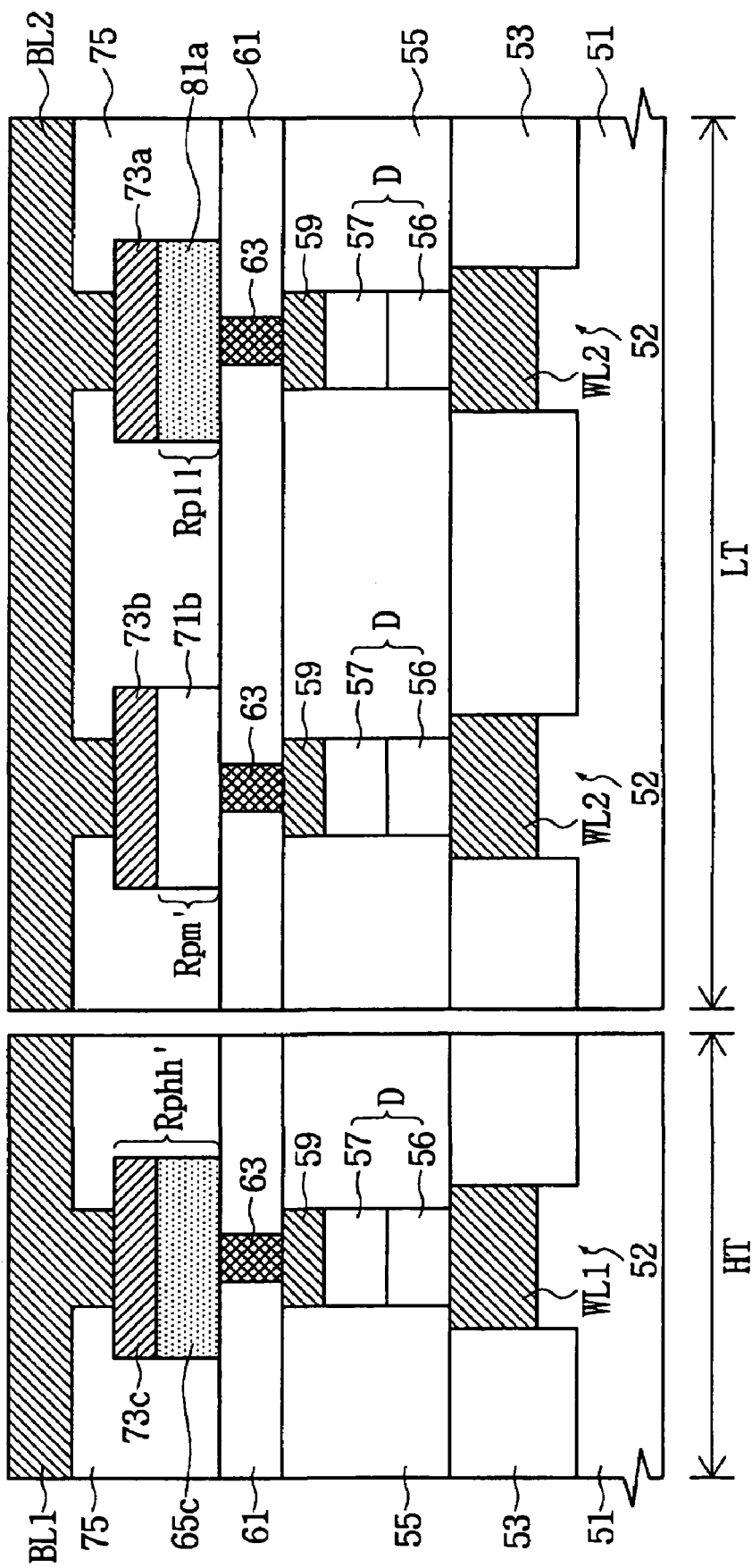
FIG. 8 is a cross sectional view illustrating respective high, medium, and low temperature memory elements in a phase change memory device according to yet other embodiments of the present invention.

In FIG. 8, the BECs 63, the ILD 61, and elements below the BECs 63 and ILD 61 are the same as discussed above with respect to FIGS. 4, 6, and 7, and will, thus, not be discussed further. In addition, the low temperature phase change memory element Rpll (including the layer of the low temperature phase change material 81a), the upper electrodes 73a-c, the ILD 75, and the bit lines BL1 and BL2 are the same as discussed above with respect to FIG. 7 and will, thus, not be discussed further herein. As shown in FIG. 8, however, the high temperature phase change memory element Rphh' may include the layer of the high temperature phase change material 65c without a barrier layer, without a layer of the medium temperature phase change material, and/or without a layer of the low temperature phase change material. Similarly, the medium temperature phase change memory element Rpm' may include the layer of the medium temperature phase change material 71b without a barrier layer and/or without a layer of the low temperature phase change material. The layer of the high temperature phase change material 65c and the layer of the medium temperature phase change material 71b may be the same as discussed above with respect to FIG. 7.

As shown in FIGS. 7 and 8, high, medium, and low temperature phase change memory elements Rphh (or Rphh'), Rpm (or Rpm'), and Rpll may provide programming at three different temperatures determined by the different crystallization temperatures of the high, medium, and low temperature phase change materials. Phase change memory elements may provide programming at any number of different temperatures using a corresponding number of phase change memory materials having different crystallization temperatures.

Figure 9:
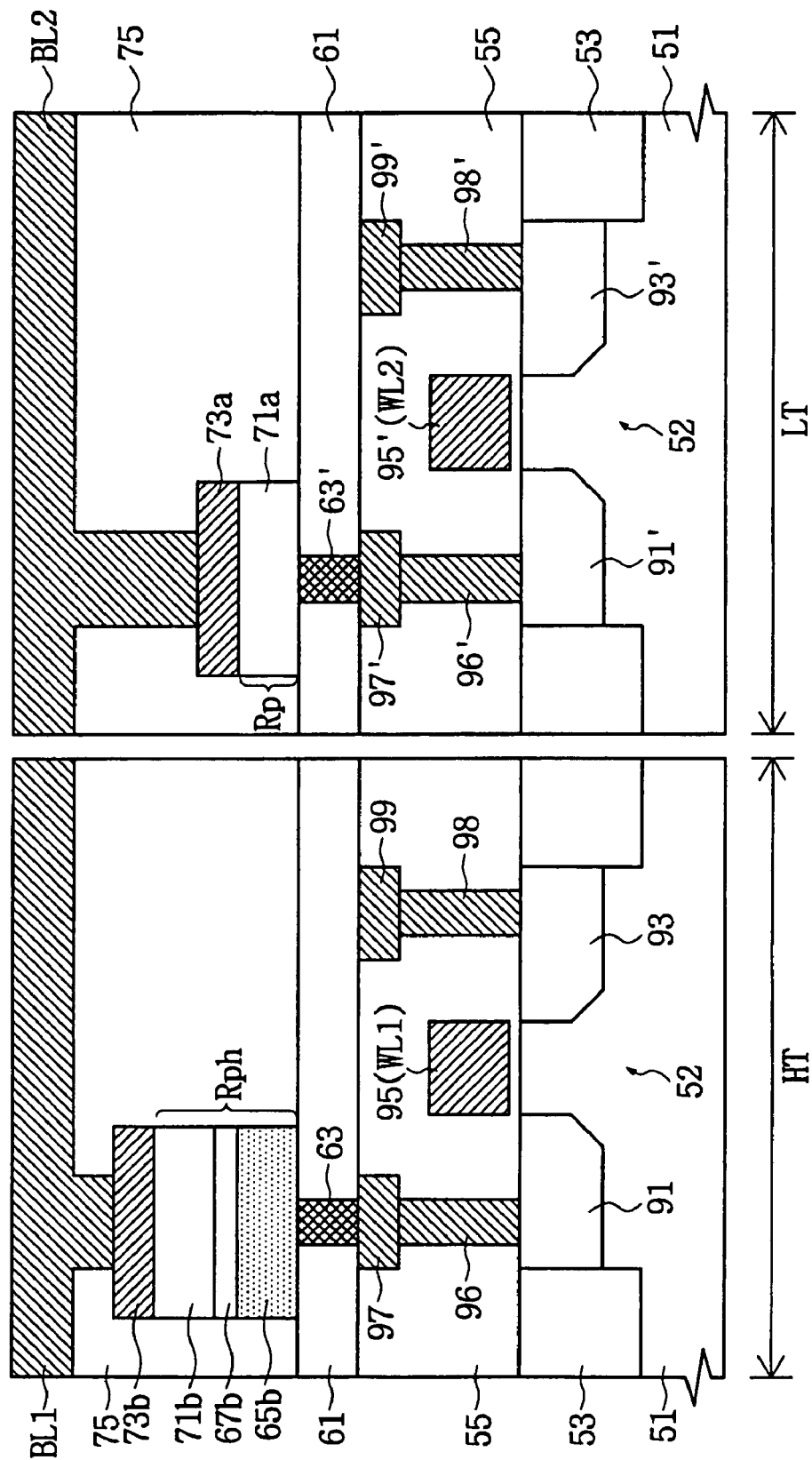
FIG. 9 is a cross sectional view illustrating high and low temperature memory elements with memory access transistors in a phase change memory device according to more embodiments of the present invention.

According to still further embodiments of the present invention, each memory cell may include a phase change memory element coupled in series with a memory access transistor as shown in FIG. 9. The memory structure of FIG. 9, for example, may be used to implement the memory architecture discussed above with respect to FIG. 3. In FIG. 9, the ILD 61, the BECs 63, the low temperature phase change memory element Rp (including the layer of low temperature phase change material 71a), the high temperature phase change memory element Rph (including the layers of the low and high temperature phase change materials 65b and 71b and the barrier layer 76b), the upper electrodes 73a and 73b, the ILD 75, and the bit lines BL1 and BL2 are the same as discussed above with respect to FIG. 4, and will thus not be discussed further herein.

As shown in FIG. 9, however, the diodes D of FIG. 4 may be replaced with respective memory access transistors including respective drain regions 91, source regions 93, and gates 95 (provided by respective word lines WL1 and WL2). More particularly, the source and drain regions 91 and 93 may be provided as doped portions of active regions 52 in semiconductor substrate 51, and insulating field regions 53 may provide isolation between memory access transistors. An ILD 55 may be formed on the gate electrodes 95 (provided by word lines WL1 and WL2) and on the source and drain regions 91 and 93. In addition, drain plugs and pads 96 and 97 may provide electrical connection between drain regions 91 and respective BECs 63. Similarly, source plugs 98 may provide electrical connection between source regions and respective source lines 99. As shown in the schematic diagram of FIG. 3, the source lines 99 may be grounded. A source line 99 for a selected memory element/cell, however, may be coupled to any reference voltage suitable for reading/writing data from/to the selected memory element/cell. A phase change memory element Rp and/or Rph may be selected for read and/or write operations by turning on the associated memory access transistor (applying a turn on voltage to the gate 95 of the associated memory access transistor) and applying appropriate electrical signals to the associated bit and source lines.

While not shown in separate figures, memory access transistors (as shown in FIG. 9) may be substituted for diodes D of the structures of any of FIGS. 4, 6, 7, and/or 8. According to still other embodiments of the present invention, a same memory device may include some phase change memory elements coupled to memory access transistors and other phase change memory elements coupled to diodes on a same semiconductor substrate. For example, memory cell access transistors may be substituted for the diodes D in the high temperature region HT of FIG. 2 while maintaining the diodes D in the low temperature region LT of FIG. 2. Stated in other words, the structure of the high temperature region HT of FIG. 3 (including memory access transistors T) may be substituted for the structure of the high temperature region HT of FIG. 2, while maintaining the structure (including diodes D) of the low temperature region LT of FIG. 2. According to other embodiments of the present invention, memory cell access transistors may be substituted for the diodes D in the low temperature region LT of FIG. 2 while maintaining the diodes D in the high temperature region HT of FIG. 2. Stated in other words, the structure of the low temperature region LT of FIG. 3 (including memory access transistors T) may be substituted for the structure of the low temperature region LT of FIG. 2, while maintaining the structure (including diodes D) of the high temperature region HT of FIG. 2.

Figure 10A:
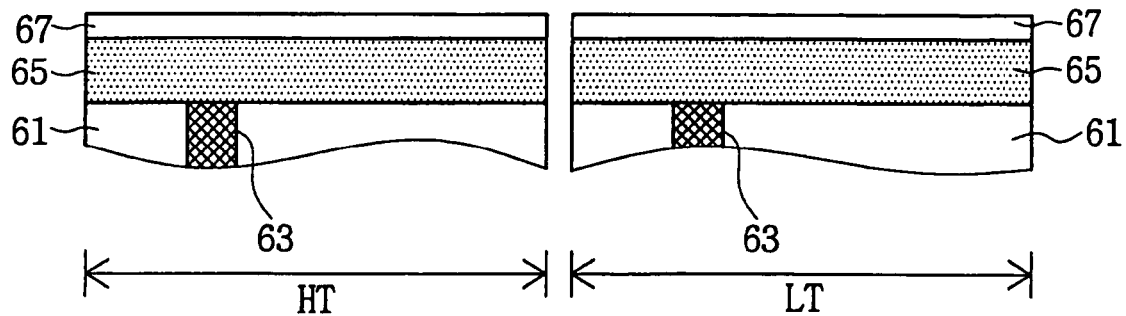
FIGS. 10A-C and 11A-D are cross sectional views illustrating operations of forming phase change memory elements according to embodiments of the present invention.
Figure 10B:
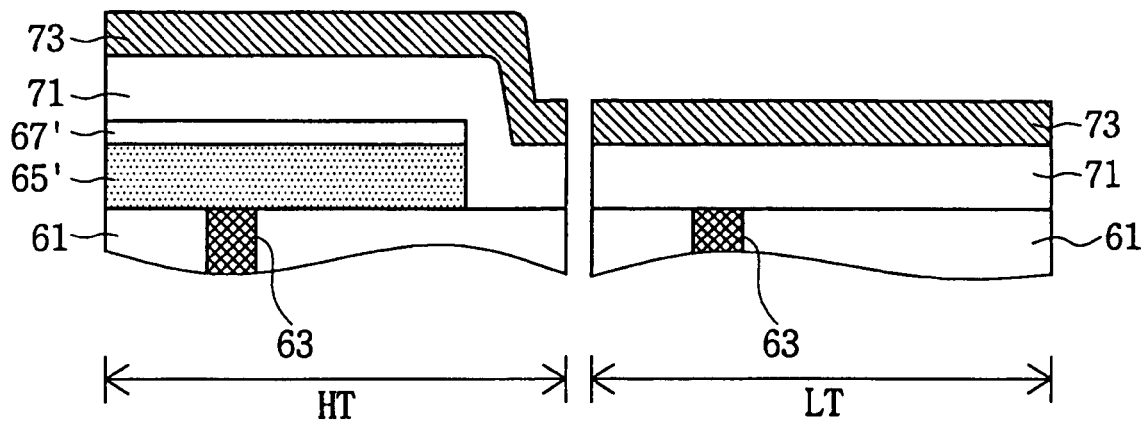
Figure 10C:
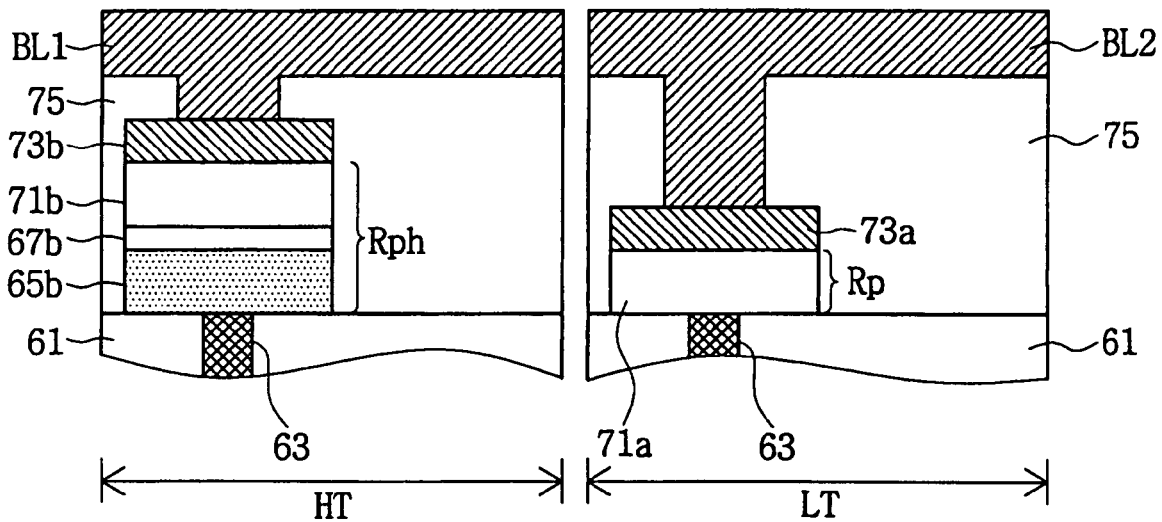

Methods of forming the phase change memory elements Rp and Rph of FIGS. 4 and/or 9 will now be discussed with reference to FIGS. 10A-C. Methods of forming phase change memory elements Rp and Rph as shown in FIGS. 10A-C may be used with diode memory structures as discussed above with respect to FIGS. 2 and 4, with transistor memory structures as discussed above with respect to FIGS. 3 and 9, and/or with combinations thereof. Accordingly, operations of forming diodes and/or memory access transistors are not shown in FIGS. 10A-C for the sake of conciseness. Elements such as the substrate 52, ILD 55, etc. are thus not shown in FIGS. 10A-C.

As shown in FIG. 10A, bottom electrode contacts (BECs) 63 may be formed extending through interlayer dielectric (ILD) 61. As discussed above, each BEC 63 may be coupled to a respective diode and/or memory access transistor. A layer of the high temperature phase change material 65 may then be formed on the ILD 65 and the BECs 63, and a barrier layer 67 may be formed on the layer of the high temperature phase change material 65.

The layer of the high temperature phase change material 65 and the barrier layer 67 may then be patterned to provide the layer of the high temperature phase change material 65' and the patterned barrier layer 67' as shown in FIG. 10B. More particularly, portions of the layer of the high temperature phase change material 65 may be removed from a low temperature region LT of the device. As further shown in FIG. 10B, a layer of a low temperature phase change material 71 may be formed on the ILD 61 and the patterned barrier layer 67', and a layer of an electrode material 73 may be formed on the layer of the low temperature phase change material 71.

As shown in FIG. 10C, the layer of the electrode material 73, the layer of the low temperature phase change material 71, the barrier layer 67', and the layer of the high temperature phase change material 65' may be patterned, for example, using a single photolithography masking operation to form the high temperature phase change memory element Rph and the low temperature phase change memory element Rp. Accordingly, the layer of the high temperature phase change material 65b, the barrier layer 67b, and the layer of the low temperature phase change material 71b of the high temperature phase change memory element Rph and the upper electrode 73b thereon may be self-aligned. Similarly, the layer of the low temperature phase change material 71b of the low temperature phase change memory element Rp and the upper electrode 73a thereon may be self-aligned.

After patterning the memory elements Rp and Rph, an ILD 75 may be formed on ILD 61 and on upper electrodes 73a and 73b, and contact holes may be formed in the ILD 75 exposing portions of the respective upper electrodes 73a and 73b, as further shown in FIG. 10C. Moreover, the bit lines BL1 and BL2 may be formed on the ILD 75 and on exposed portions of the upper electrodes 73a and 73b. to provide the structure of FIGS. 4 and 9. While not shown in FIGS. 10A-C, operations thereof may be extended to provide memory devices including high, medium, and low temperature phase change memory elements on as same semiconductor substrate as discussed above with respect to FIG. 7.

Methods of forming the phase change memory elements Rp and Rph' of FIG. 6 will now be discussed with reference to FIGS. 11A-D. Methods of forming phase change memory elements Rp and Rph' as shown in FIGS. 11A-D may be used with diode memory structures as discussed above with respect to FIGS. 2 and 6, with transistor memory structures as discussed above with respect to FIG. 3, and/or with combinations thereof. Accordingly, operations of forming diodes and/or memory access transistors are not shown in FIGS. 11A-D for the sake of conciseness. Elements such as the substrate 52, ILD 55, etc. are thus not shown in FIGS. 11A-D.

Figure 11A:
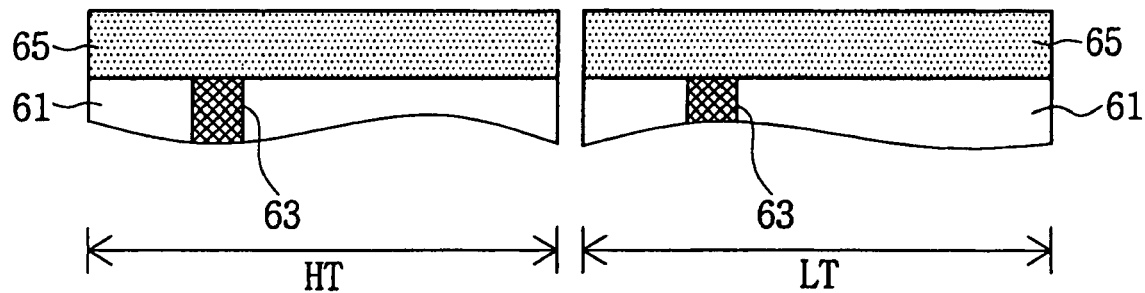

As shown in FIG. 11A, bottom electrode contacts (BECs) 63 may be formed extending through interlayer dielectric (ILD) 61. As discussed above, each BEC 63 may be coupled to a respective diode and/or memory access transistor. A layer of the high temperature phase change material 65 may then be formed on the ILD 65 and the BECs 63.

Figure 11B:
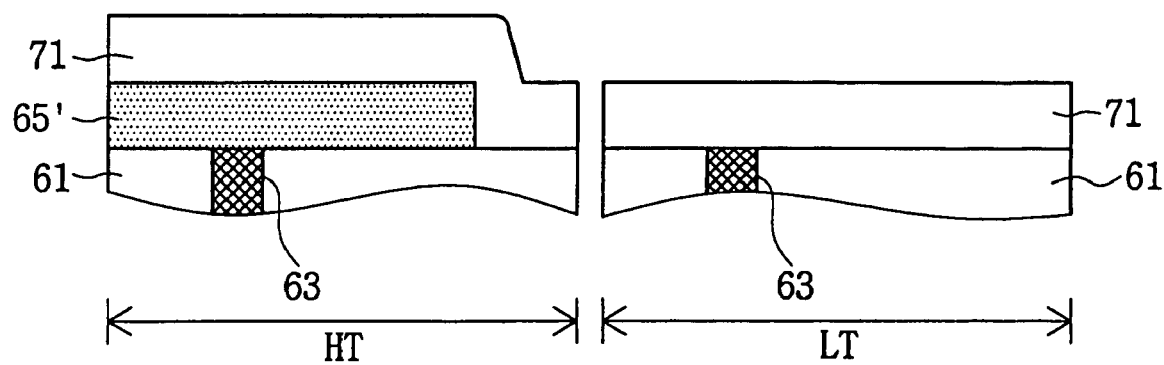

The layer of the high temperature phase change material 65 may then be partially patterned to provide the layer of the high temperature phase change material 65' and as shown in FIG. 11B. More particularly, portions of the layer of the high temperature phase change material 65 may be removed from a low temperature region LT of the device. As further shown in FIG. 11B, a layer of a low temperature phase change material 71 may be formed on the ILD 61 and the layer of the high temperature phase change material 65'.

Figure 11C:
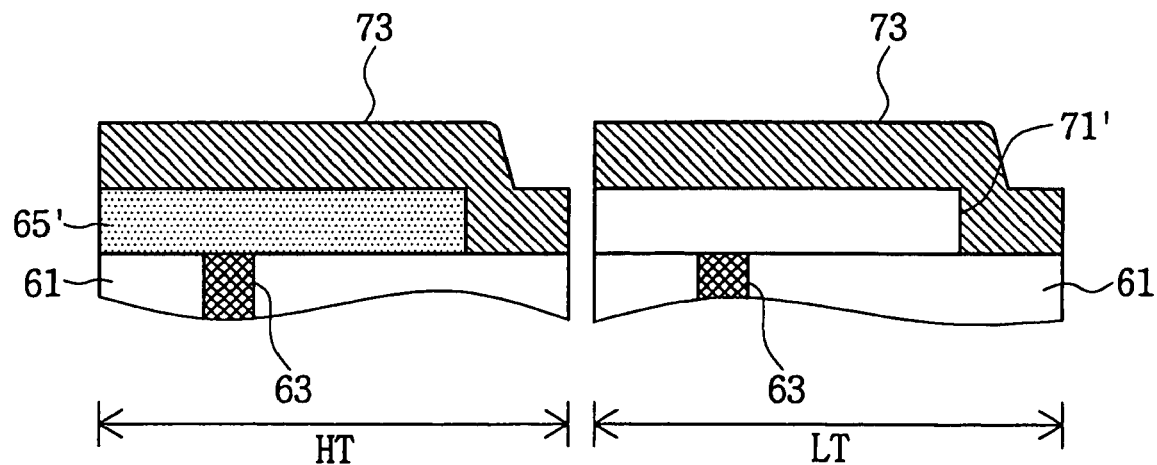

The layer of the low temperature phase change material 71 may be partially patterned to provide the layer of the low temperature phase change material 71' as shown in FIG. 11C. More particularly, portions of the layer of the low temperature phase change material 71 may be removed from a high temperature region HT of the device. As further shown in FIG. 11C, a layer of an electrode material 73 may then be formed on the layer of the low temperature phase change material 71', on the layer of the high temperature phase change material 65', and on the ILD 61.

The layer of the electrode material 73, the layer of the low temperature phase change material 71', and the layer of the high temperature phase change material 65' may be patterned, for example, using a single photolithography masking operation to form the high temperature phase change memory element Rph' and the low temperature phase change memory element Rp. Accordingly, the layer of the high temperature phase change material 65b of the high temperature phase change memory element Rph' and the upper electrode 73b thereon may be self-aligned. Similarly, the layer of the low temperature phase change material 71b of the low temperature phase change memory element Rp and the upper electrode 73a thereon may be self-aligned.

Figure 11D:
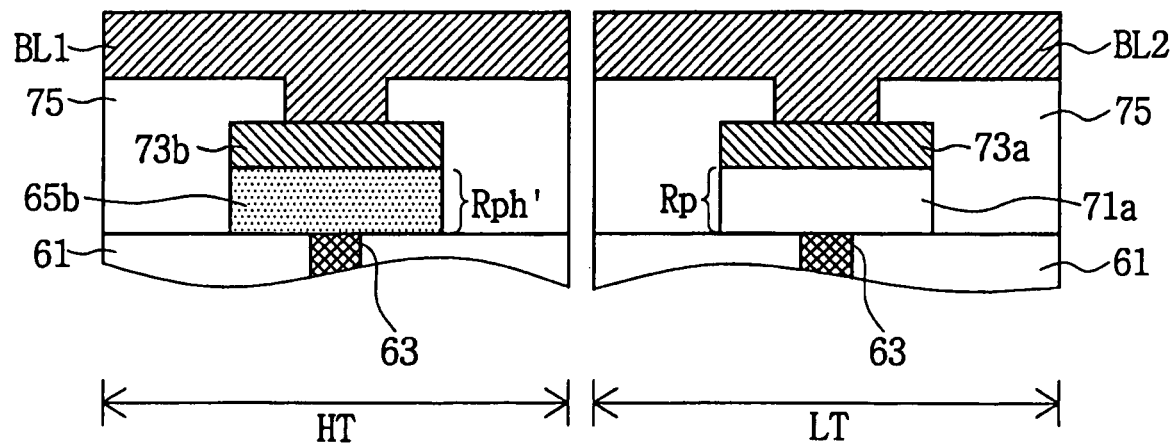

After patterning the memory elements Rp and Rph', an ILD 75 may be formed on ILD 61 and on upper electrodes 73a and 73b, and contact holes may be formed in the ILD 75 exposing portions of the respective upper electrodes 73a and 73b, as further shown in FIG. 11D. Moreover, the bit lines BL1 and BL2 may be formed on the ILD 75 and on exposed portions of the upper electrodes 73a and 73b to provide the structure of FIG. 6. While not shown in FIGS. 11A-D, operations thereof may be extended to provide memory devices including high, medium, and low temperature phase change memory elements on as same semiconductor substrate as discussed above with respect to FIG. 8.

Figure 12A:
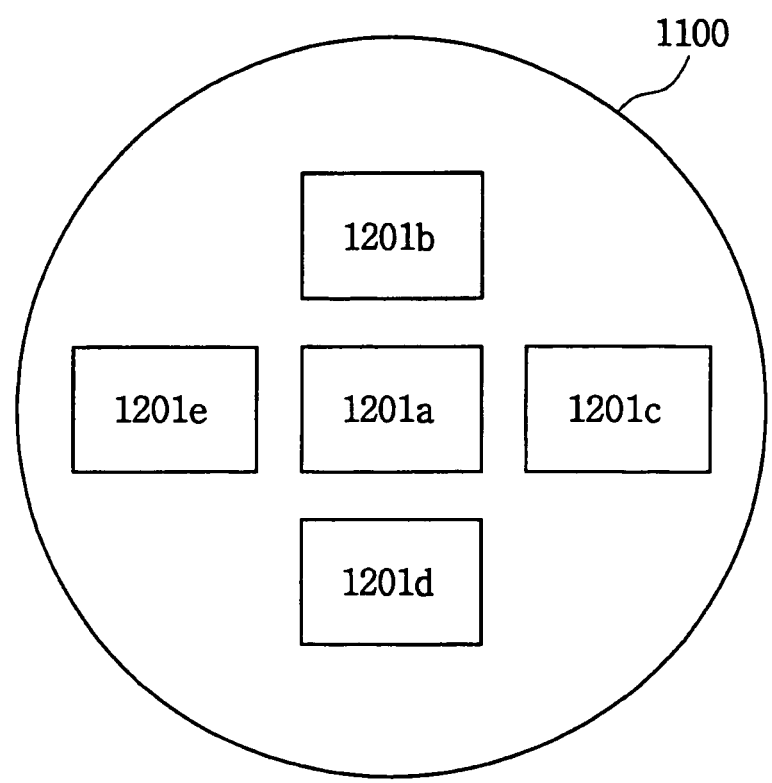
FIG. 12A is a plan view illustrating a semiconductor integrated circuit wafer including a plurality of phase change memory devices including high and low temperature phase change memory elements according to embodiments of the present invention.

According to still further embodiments of the present invention, a plurality of memory devices 1201a-e, as discussed above with respect to FIGS. 2, 3, 4, 6, 7, 8, 9, 10A-C, and/or 11A-D (including high and low temperature phase change memory elements), may be fabricated on a same semiconductor wafer 1100 as shown in FIG. 12a. The plurality of memory devices 1201a-d may then be separated, for example, by dicing the substrate 1100 to provide a plurality of separate memory devices including the memory device 1201 shown in FIG. 12b.

High temperature phase change memory elements of the memory devices 1201a-e may be programmed with Read Only Memory (ROM) before assembly onto an electronic substrate (e.g., a printed circuit board PCB) or other component of an electronic system. More particularly, the high temperature phase change memory elements of the memory devices 1201a-e may be programmed with ROM either before or after dicing from the wafer, and then, the separate memory devices 1201a-e (including ROM programmed high temperature phase change memory elements) may be electrically and mechanically coupled (such as by soldering) to one or more respective electronic substrates.

Figure 12B:
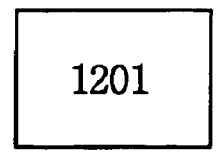
FIG. 12B is a plan view illustrating an individual phase change memory device including high and low temperature phase change memory elements after dicing from the wafer of FIG. 12A according to embodiments of the present invention.
Figure 12C:
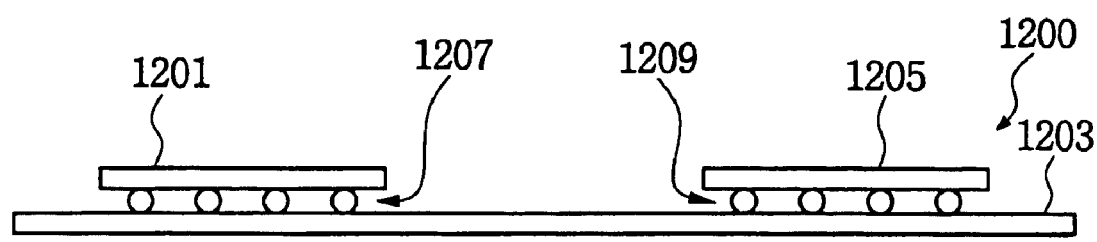
FIG. 12C is a cross sectional view illustrating an electronic system including a phase change memory device including high and low temperature phase change memory elements according to embodiments of the present invention.

A memory device 1201 from the wafer 1100 of FIGS. 12a and 12b may provide memory for an electronic system 1200, such as a computing device, communications device, entertainment device, etc., as shown in FIG. 12c. More particularly, a memory device 1201 may be soldered to an electronic substrate 1203 (such as a printed circuit board) together with a processor 1205 of an electronic system 1200. The electronic system 1200 may also include, for example, a user input device(s) (e.g., a keypad, a dial, a joy stick, a touch sensitive screen, etc.), an output device(s) (e.g., a display screen, a printer), a speaker, and/or a microphone, electrically coupled to the electronic substrate 1203, the processor 1205, and/or the memory device 1201. While the memory device 1201 and the processor 1205 are shown on the same electronic substrate 1203, by way of example, the memory device 1201 and the processor 1205 may be provided on different substrates. Electrical coupling between the memory device 1201 and the processor 1205, may be provided, for example, using conductive traces on/in the electronic substrate 1203. Moreover, the memory device 1201 and the processor 1205 may be electrically and mechanically coupled to the electronic substrate 1203, for example, using respective solder bumps 1207 and 1209.

The ROM programmed high temperature phase change memory elements of the memory device 1201 may provide ROM for the electronic system 1200, while the low temperature phase change memory elements may provide Random Access Memory (RAM) that may be used by the electronic system 1200 to read and write data during operation of the electronic system 1200. Because high temperature phase change memory elements of the memory device 1201 are programmed at a temperature higher than any temperature encountered when coupling the memory device 1201 to the electronic substrate 1203 (such as by soldering), ROM can be efficiently programmed before coupling the memory device 1201 to the electronic substrate. Because the low temperature phase change memory elements can be programmed at a relatively low temperature (such as a temperature less than a soldering temperature), less power may be required to write data to the low temperature phase change memory elements (used as RAM) during operation of the electronic system 1200. If the electronic system 1200 is battery powered, battery life may thus be increased by using low temperature phase change memory elements to provide RAM.

Figure 13:
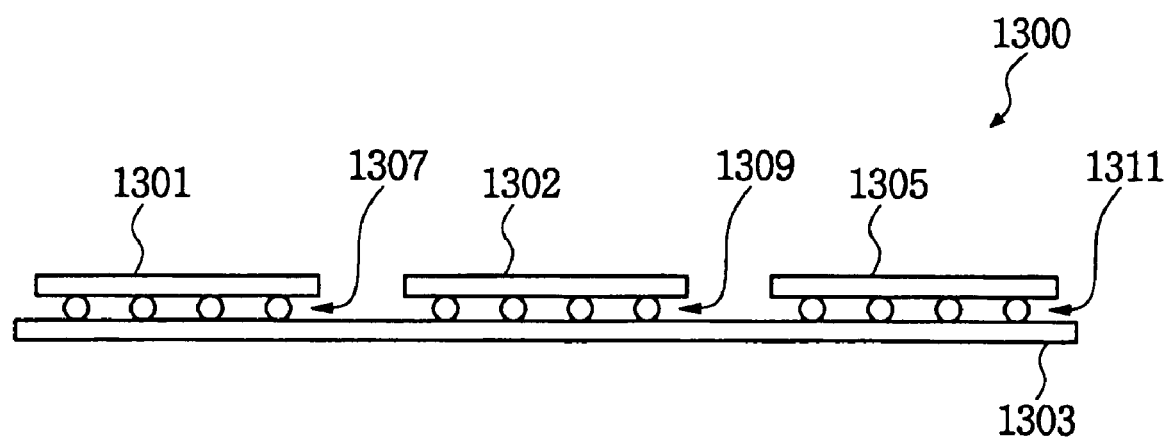
FIG. 13 is a cross sectional view illustrating an electronic system including a high temperature phase change memory device and a low temperature phase change memory device according to embodiments of the present invention.

According to yet further embodiments of the present invention shown in FIG. 13, an electronic system 1300 (such as a computing device, communications device, entertainment device, etc.) may include a first memory device 1301 including high temperature phase change memory elements and a second memory device 1302 including low temperature phase change memory elements. More particularly, the first phase change memory device 1301 may include a plurality of low temperature phase change memory elements on a first semiconductor substrate, the second phase change memory device 1302 may include a plurality of high temperature phase change memory elements on a second semiconductor substrate, and the first and second semiconductor substrates may be different. Accordingly, memory elements of the first memory device 1301 are programmable at a first temperature, memory elements of the second memory device 1302 are programmable at a second temperature, and the first temperature is greater than the second temperature.

As shown in FIG. 13, the first and second memory devices 1301 and 1302 and a processor 1305 may be coupled to an electronic substrate 1303 (such as a printed circuit board), for example, using respective solder bumps 1307, 1309, and 1311. The electronic system 1300 may also include, for example, a user input device(s) (e.g., a keypad, a dial, a joy stick, a touch sensitive screen, etc.), an output device(s) (e.g., a display screen, a printer), a speaker, and/or a microphone, electrically coupled to the electronic substrate 1303, the processor 1305, and/or the memory devices 1301 and 1302. While the memory devices 1301 and 1302 and the processor 1305 are shown on the same electronic substrate 1303, by way of example, the memory device 1301, the memory device 1302, and/or the processor 1305 may be provided on different substrates. Electrical coupling between the memory devices 1301 and 1302 and the processor 1305, may be provided, for example, using conductive traces on/in the electronic substrate 1303.

The first memory device 1301 (including high temperature phase change memory elements) may be programmed with ROM prior to coupling (such as by soldering) to the electronic substrate 1303. In contrast, the second memory device 1302 may provide RAM that to/from which data may be written and read after coupling (such as by soldering) to the electronic substrate 1303.

The ROM programmed high temperature phase change memory elements of the first memory device 1301 may provide ROM for the electronic system 1300, while the low temperature phase change memory elements of the second memory device 1302 may provide Random Access Memory (RAM) that may be used by the electronic system 1200 to read and write data during operation of the electronic system 1300. Because high temperature phase change memory elements of the first memory device 1301 are programmed at a temperature higher than any temperature encountered when coupling the first memory device 1301 to the electronic substrate 1303 (such as by soldering), ROM can be efficiently programmed before coupling the first memory device 1301 to the electronic substrate 1303. Because the low temperature phase change memory elements of the second memory device 1302 can be programmed at a relatively low temperature (such as a temperature less than a soldering temperature), less power may be required to write data to the low temperature phase change memory elements (used as RAM) during operation of the electronic system 1300. If the electronic system 1300 is battery powered, battery life may thus be increased by using low temperature phase change memory elements to provide RAM.

While separate high temperature and low temperature regions HT and LT of semiconductor substrate 51 are shown in FIGS. 2, 3, 4, 6, 7, 8, and 9 for the sake of clarity, the semiconductor substrate 51 in each of the indicated figures may be a single semiconductor die for an integrated circuit memory device including both the high temperature and low temperature regions HT and LT. Moreover, the semiconductor die including both the high temperature and low temperature regions HT and LT may be fabricated on a semiconductor wafer including a plurality of such semiconductor die, and the plurality of semiconductor die may be separated after fabrication by dicing.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. A phase change memory device comprising:
    an integrated circuit substrate;
    a first phase change memory element on the integrated circuit substrate, wherein the first phase change memory element includes a first phase change material having a first crystallization temperature; and
    a second phase change memory element on the integrated circuit substrate, wherein the second phase change memory element includes a second phase change material having a second crystallization temperature, and wherein the first and second crystallization temperatures are different so that the first and second phase change memory elements are programmable at different temperatures.

2. A phase change memory device according to claim 1 wherein the second phase change memory element is free of the first phase change material.

3. A phase change memory device according to claim 2 wherein the first phase change memory element is free of the second phase change material.

4. A phase change memory device according to claim 2 wherein the first phase change memory element includes a first layer of the first phase change material and a second layer of the second phase change material.

5. A phase change memory device according to claim 4 further comprising:
    a barrier layer in the first phase change memory element, wherein the barrier layer is between the first layer of the first phase change material and the second layer of the second phase change material.

6. A phase change memory device according to claim 5 wherein the barrier layer comprises a layer of titanium and/or titanium nitride.

7. A phase change memory device according to claim 1 wherein the first crystallization temperature is at least 50 degrees C. greater than the second crystallization temperature.

8. A phase change memory device according to claim 1 wherein the first crystallization temperature is at least 100 degrees C. greater than the second crystallization temperature.

9. A phase change memory device according to claim 1 wherein the first phase change material is selected from the group consisting of GaSb, InGaSb$_2$, and/or Ge$_{15}$Sb$_{85}$, wherein the second phase change material is selected from the group consisting of InSb, InGaSb$_2$, Ge$_1$Sb$_4$Te$_7$, Ge$_1$Sb$_2$Te$_4$, Ge$_2$Sb$_2$Te$_5$, GeTe, and/or Sb$_2$Te, and wherein the first and second phase change materials are different.

10. A phase change memory device according to claim 1 wherein the first and second phase change materials comprises different chalcogenide materials.

11. A phase change memory device according to claim 1 further comprising:
    a third phase change memory element on the integrated circuit substrate, wherein the third phase change memory element includes a third phase change material having a third crystallization temperature, and wherein the third crystallization temperature is different than the first and second crystallization temperatures so that the first, second, and third phase change memory elements are programmable at different temperatures.

12. A phase change memory device according to claim 1 further comprising:
    a first diode electrically coupled in series with the first phase change memory element between a first word line and a first bit line; and
    a second diode electrically coupled in series with the second phase change memory element between a second word line and a second bit line.

13. A phase change memory device according to claim 1 further comprising:
    a first memory access transistor, wherein the first phase change memory element is electrically coupled between a first bit line and a terminal of the first memory access transistor; and
    a second memory access transistor, wherein the second phase change memory element is electrically coupled between a second bit line and a terminal of the second memory access transistor.

14. A phase change memory device according to claim 1 further comprising:
    a diode electrically coupled in series with the first phase change memory element between a first word line and a first bit line; and
    a memory access transistor, wherein the second phase change memory element is electrically coupled between a second bit line and a terminal of the memory access transistor.

15. A phase change memory device according to claim 1 further comprising:
    an electronic substrate electrically and mechanically coupled to the integrated circuit substrate; and
    a processor electrically coupled to the integrated circuit substrate through the electronic substrate.

16. A phase change memory device according to claim 15 wherein the first crystallization temperature is higher than the second crystallization temperature, wherein the processor is configured to read data from the first phase change memory element without writing data to the first phase change memory element, and wherein the processor is configured to write data to and read data from the second phase change memory element.

17. A method of forming a phase change memory device, the method comprising:
    forming a first phase change memory element on a first memory region of an integrated circuit substrate, wherein the first phase change memory element includes a first phase change material having a first crystallization temperature; and
    forming a second phase change memory element on a second memory region of the integrated circuit substrate, wherein the second phase change memory element includes a second phase change material having a second crystallization temperature, and wherein the first and second crystallization temperatures are different so that the first and second phase change memory elements are programmable at different temperatures.

18. A method according to claim 17, wherein forming the first phase change memory element includes forming a layer of the first phase change material on the first memory region wherein the second memory region is free of the layer of the first phase change material, and wherein forming the second phase change memory element includes forming a layer of the second phase change material on the second memory region after forming the layer of the first phase change material.

19. A method according to claim 18 wherein forming the layer of the first phase change material comprises,
    forming the layer of the first phase change material on the first and second memory regions, and
    removing portions of the layer of the first phase change material from the second memory region while maintaining portions of the layer of the first phase change material on the first memory region.

20. A method according to claim 18 wherein forming the layer of the second phase change material comprises,
    forming the layer of the second phase change material on the second memory region and on the layer of the first phase change material on the first memory region, and
    removing portions of the layer of the second phase change material between the first and second memory regions while maintaining portions of the layer of second phase change material on the second memory region.

21. A method according to claim 20 wherein removing portions of the layer of the second phase change material includes removing portions of the layer of the second phase change material from the layer of the first phase change material on the first memory region.

22. A method according to claim 20 wherein removing portions of the layer of the second phase change material includes maintaining portions of the second phase change material on the layer of the first phase change material on the first memory region.

23. A method according to claim 22 further comprising:
    before forming the layer of the second phase change material, forming a barrier layer on the layer of the first phase change material so that the barrier layer is between the first layer of the first phase change material and the second layer of the second phase change material in the first memory region.

24. A method according to claim 23 wherein the barrier layer comprises a layer of titanium and/or titanium nitride.

25. A method according to claim 17 wherein the first crystallization temperature is at least 50 degrees C. greater than the second crystallization temperature.

26. A method according to claim 17 wherein the first crystallization temperature is at least 100 degrees C. greater than the second crystallization temperature.

27. A method according to claim 17 wherein the first phase change material is selected from the group consisting of GaSb, InGaSb$_2$, and/or Ge$_{15}$Sb$_{85}$, wherein the second phase change material is selected from the group consisting of InSb, InGaSb$_2$, Ge$_1$Sb$_4$Te$_7$, Ge$_1$Sb$_2$Te$_4$, Ge$_2$Sb$_2$Te$_5$, GeTe, and/or Sb$_2$Te, and wherein the first and second phase change materials are different.

28. A method according to claim 17 wherein the first and second phase change materials comprises different chalcogenide materials.

29. A method according to claim 17, the method further comprising:
    forming a third phase change memory element on the integrated circuit substrate, wherein the third phase change memory element includes a third phase change material having a third crystallization temperature, and wherein the third crystallization temperature is different than the first and second crystallization temperatures so that the first, second, and third phase change memory elements are programmable at different temperatures.

30. A method according to claim 17 further comprising:
    before forming the first and second phase change memory elements, forming first and second diodes in the respective first and second memory regions so that the first diode is electrically coupled between the first phase change memory element and a first word line, and the second diode is electrically coupled between the second phase change memory element and a second word line.

31. A method according to claim 17 further comprising:
    before forming the forming the first and second phase change memory elements, forming first and second memory access transistors in the respective first and second memory regions so that the first phase change memory element is electrically coupled to a terminal of the first memory access transistor, and the second phase change memory element is electrically coupled to a terminal of the second memory access transistor.

32. A method according to claim 17 further comprising:
    before forming the first phase change memory element, forming a diode in the first memory region so that the diode is electrically coupled in series with the first phase change memory element between a first word line and a first bit line; and
    before forming the second phase change memory element, forming a memory access transistor in the second memory region so that the second phase change memory element is electrically coupled between a second bit line and a terminal of the memory access transistor.

33. A method according to claim 17 wherein the first crystallization temperature is higher than the second crystallization temperature, the method further comprising:
    after forming the first and second phase change memory elements, programming the first phase change memory element; and
    after programming the first phase change memory element, electrically and mechanically coupling the integrated circuit substrate to an electronic substrate so that a processor is electrically coupled to the integrated circuit substrate through the electronic substrate.

34. A method according to claim 33 wherein electrically and mechanically coupling the integrated circuit substrate to the electronic substrate comprises reflowing solder and wherein a reflow temperature of the solder is less than the first crystallization temperature.

35. A method according to claim 34 wherein the reflow temperature of the solder is greater than the second crystallization temperature.

36. A method according to claim 34 wherein the processor is configured to read data from the first phase change memory element without writing data to the first phase change memory element, and wherein the processor is configured to write data to and read data from the second phase change memory element.

37. An electronic system comprising:
    an electronic substrate;
    a phase change memory device electrically and mechanically coupled to the electronic substrate, wherein the phase change memory device includes a first phase change memory element on an integrated circuit substrate, wherein the first phase change memory element includes a first phase change material having a first crystallization temperature, and a second phase change memory element on the integrated circuit substrate, wherein the second phase change memory element includes a second phase change material having a second crystallization temperature, and wherein the first and second crystallization temperatures are different so that the first and second phase change memory elements are programmable at different temperatures; and a processor electrically coupled to the electronic substrate so that the processor and the phase change memory device are electrically coupled through the electronic substrate.

38. An electronic system according to claim 37 wherein the first crystallization temperature is at least 50 degrees C. greater than the second crystallization temperature.

39. An electronic system according to claim 37 wherein the first and second phase change materials comprise different chalcogenide materials.

40. An electronic system according to claim 37 wherein the processor is configured to read data from the first phase change memory element without writing data to the first phase change memory element, and wherein the processor is configured to write data to and read data from the second phase change memory element.

41. An electronic system comprising:
an electronic substrate;
a first phase change memory device electrically and mechanically coupled to the electronic substrate, wherein the first phase change memory device includes a plurality of first phase change memory elements on a first integrated circuit substrate, wherein each of the first phase change memory elements includes a first phase change material having a first crystallization temperature;
a second phase change memory device electrically and mechanically coupled to the electronic substrate, wherein the second phase change memory device includes a plurality of second phase change memory elements on a second integrated circuit substrate, wherein each of the second phase change memory elements includes a second phase change material having a second crystallization temperature, and wherein the first and second crystallization temperatures are different so that the first and second phase change memory elements are programmable at different temperatures; and
a processor electrically coupled to the electronic substrate so that the processor and the first and second phase change memory devices are electrically coupled through the electronic substrate.

42. An electronic system according to claim 41 wherein the first crystallization temperature is at least 50 degrees C. greater than the second crystallization temperature.

43. An electronic system according to claim 41 wherein the first and second phase change materials comprise different chalcogenide materials.

44. An electronic system according to claim 41 wherein the processor is configured to read data from the first phase change memory device without writing data to the first phase change memory device, and wherein the processor is configured to write data to and read data from the second phase change memory device.

45. A method of operating an electronic system including a first plurality of phase change memory elements each including a first phase change material having a first crystallization temperature, and a second plurality of phase change memory elements each including a second phase change material having a second crystallization temperature wherein the first and second crystallization temperatures are different so that the first and second pluralities of phase change memory elements are programmable at different temperatures, and a processor electrically coupled to the first and second pluralities of phase change memory elements, the method comprising:
reading ROM data from the first plurality of phase change memory elements to the processor without writing the ROM data from the processor to the first plurality of phase change memory elements;
writing programmable data from the processor to the second plurality of phase change memory elements; and
after writing the programmable data, reading the programmable data from the second plurality of phase change memory elements to the processor.

46. A method according to claim 45 wherein the first crystallization temperature is at least 50 degrees C. greater than the second crystallization temperature.

47. A method according to claim 45 wherein the first and second phase change materials comprise different chalcogenide materials.

48. A method according to claim 45 wherein the first and second pluralities of phase change memory elements are provided on a same semiconductor integrated circuit substrate.

49. A method according to claim 45 wherein the first and second pluralities of phase change memory elements are provided on respective first and second semiconductor integrated circuit substrates.

50. An electronic system comprising:
a first plurality of phase change memory elements each including a first phase change material having a first crystallization temperature;
a second plurality of phase change memory elements each including a second phase change material having a second crystallization temperature wherein the first and second crystallization temperatures are different so that the first and second pluralities of phase change memory elements are programmable at different temperatures; and
a processor electrically coupled to the first and second pluralities of phase change memory elements, wherein the processor is configured to
read ROM data from the first plurality of phase change memory elements without writing the ROM data from the processor to the first plurality of phase change memory elements,
write programmable data to the second plurality of phase change memory elements, and
read the programmable data from the second plurality of phase change memory elements after writing the programmable data.

51. An electronic system according to claim 50 wherein the first crystallization temperature is at least 50 degrees C. greater than the second crystallization temperature.

52. An electronic system according to claim 50 wherein the first and second phase change materials comprise different chalcogenide materials.

53. An electronic system according to claim 50 wherein the first and second pluralities of phase change memory elements are provided on a same semiconductor integrated circuit substrate.

54. An electronic system according to claim 50 wherein the first and second pluralities of phase change memory elements are provided on respective first and second semiconductor integrated circuit substrates.

* * * * *